US011450629B2

(12) United States Patent
Aygun et al.

(10) Patent No.: US 11,450,629 B2
(45) Date of Patent: Sep. 20, 2022

(54) INTRA-SEMICONDUCTOR DIE COMMUNICATION VIA WAVEGUIDE IN A MULTI-DIE SEMICONDUCTOR PACKAGE

(71) Applicant: Intel Corporation, Santa Clara, CA (US)

(72) Inventors: Kemal Aygun, Tempe, AZ (US); Zhi Guo Qian, Chandler, AZ (US); Jian Yong Xie, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 180 days.

(21) Appl. No.: 16/643,554

(22) PCT Filed: Sep. 29, 2017

(86) PCT No.: PCT/US2017/054580
§ 371 (c)(1),
(2) Date: Feb. 29, 2020

(87) PCT Pub. No.: WO2019/066956
PCT Pub. Date: Apr. 4, 2019

(65) Prior Publication Data
US 2020/0203293 A1 Jun. 25, 2020

(51) Int. Cl.
H01L 23/66 (2006.01)
H01P 3/16 (2006.01)
(52) U.S. Cl.
CPC .............. H01L 23/66 (2013.01); H01P 3/16 (2013.01); H01L 2223/6627 (2013.01)
(58) Field of Classification Search
CPC ..... H01L 23/66; H01L 2223/6627; H01P 3/16
See application file for complete search history.

(56) References Cited

U.S. PATENT DOCUMENTS 6,868,258 B2    3/2005  Hayata et al.
2005/0085209 A1 4/2005  Hiramatsu et al.
(Continued)

FOREIGN PATENT DOCUMENTS

EP      3249742 A1 * 11/2017 ............... C08J 5/18
WO   WO 2016-159314    10/2016

OTHER PUBLICATIONS

International Search Report and Written Opinion for International Patent Application No. PCT/US2017/054580, dated Jun. 21, 2018,— 10 pgs.
(Continued)

Primary Examiner — Stephen E. Jones
Assistant Examiner — Kimberly E Glenn
(74) Attorney, Agent, or Firm — Schwabe, Williamson & Wyatt, P.C.

(57) ABSTRACT

An interposer layer includes an integral waveguide to facilitate high speed (e.g., greater than 80 GHz) communication between semiconductor dies in a semiconductor package. An interposer layer may include a waveguide member and a dielectric layer disposed adjacent at least a portion of an exterior perimeter of the waveguide member. The waveguide member includes a material having a first relative permittivity. The dielectric member includes a material having a second relative permittivity that is less than the first relative permittivity. The waveguide member and the dielectric member form an interposer layer having an upper surface and a lower surface. A first conductive sheet may be disposed proximate the upper surface of the interposer layer and a second conductive sheet may be disposed proximate the lower surface of the interposer layer.

25 Claims, 14 Drawing Sheets

(56) References Cited

U.S. PATENT DOCUMENTS

2005/0251994 A1 11/2005 Yuasa
2009/0017255 A1 1/2009 Maruyama et al.

OTHER PUBLICATIONS

International Preliminary Report on Patentability for International Patent Application No. PCT/US2017/054580, dated Apr. 9, 2020, 9 pgs.

* cited by examiner

INTRA-SEMICONDUCTOR DIE COMMUNICATION VIA WAVEGUIDE IN A MULTI-DIE SEMICONDUCTOR PACKAGE

CROSS-REFERENCE TO RELATED APPLICATIONS

This patent application is a U.S. National Phase Application under 35 U.S.C. § 371 of International Application No. PCT/US17/54580, filed on Sep. 29, 2017, the entire contents of which is hereby incorporated by reference herein.

TECHNICAL FIELD

The present disclosure relates to communication between semiconductor dies in a multi-die semiconductor package.

BACKGROUND

Typically microstrips or striplines are used to communicably couple semiconductor dies in a semiconductor package. As communication speeds increase, striplines and microstrips suffer from high resistive and capacitive losses. The resistive and capacitive losses limit the practical effective bandwidth of such structures to 10 GHz to 30 GHz.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1A:
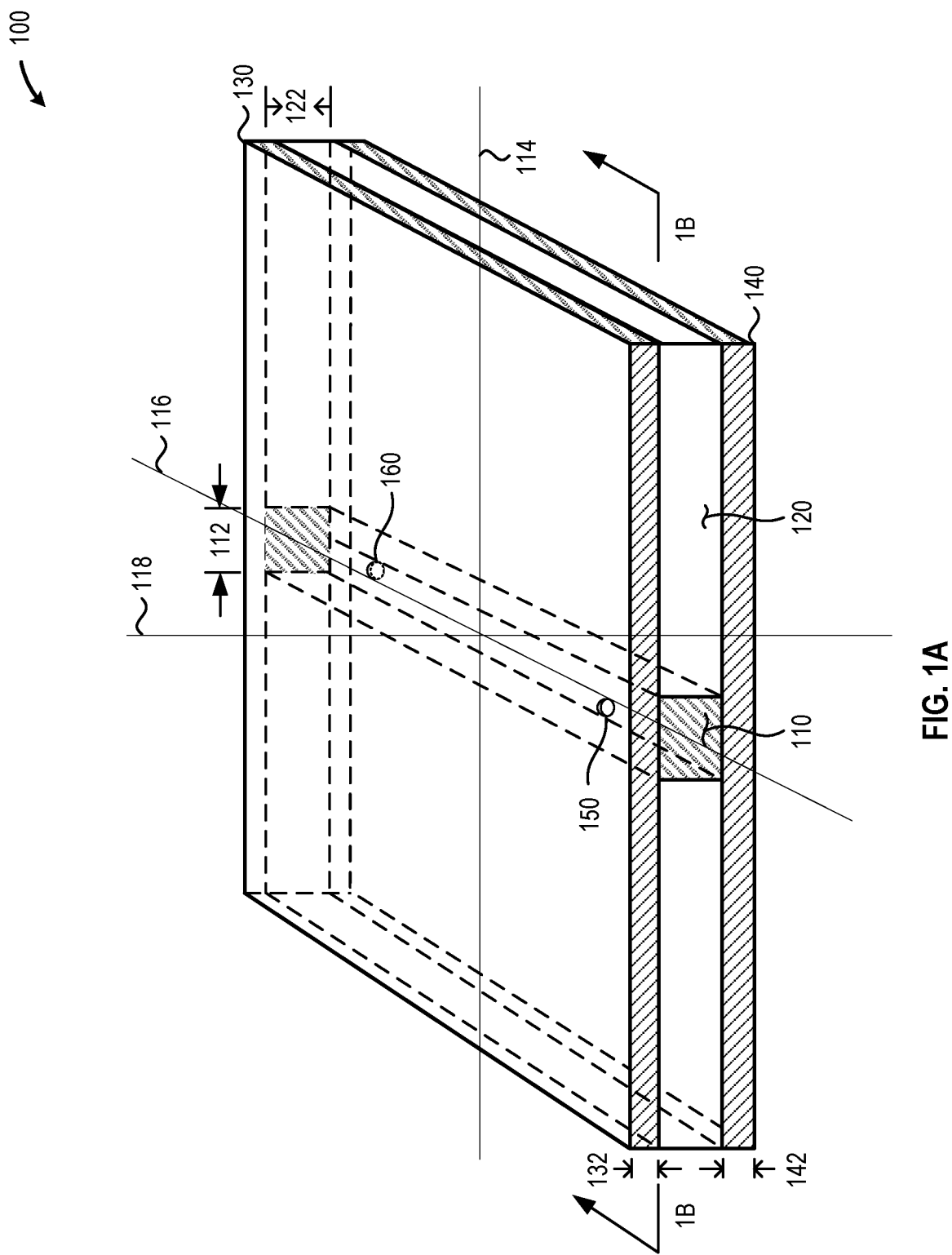
FIG. 1A is a perspective view of an illustrative interposer layer with a waveguide, dielectric member, both sandwiched at least partially between an upper conductive sheet, and a lower conductive sheet, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

As Serializer/Deserializer (SERDES) per-lane speed approaches 100 GHz to 200 GHz, existing interconnect technologies such as microstrips and striplines cannot scale to address signaling demands. The systems and methods described herein represent a significant step forward in communication between semiconductor dies through the use of an interposer layer having an integrated waveguide to provide inter-die communication at speeds an order of magnitude greater than previously achievable using microstrips or striplines.

The systems and methods described herein disclose various interposer layer constructs, each including at least one waveguide member. In a first embodiment, an interposer layer may include a solid waveguide member constructed from a material having a first relative permittivity. A dielectric material having a lower relative permittivity may be disposed adjacent at least a portion of the solid waveguide member such that the solid waveguide and the dielectric form an interposer layer having a planar structure with an upper surface and a lower surface. Conductive plates or sheets may be disposed on the upper and lower surfaces of the interposer layer. Another interposer layer construct includes a hollow waveguide member disposed in a dielectric material. An additional interposer layer construction includes a dielectric material having a channel formed therein. A metal layer may be disposed at least in the channel. A conductive sheet may be disposed above the channel to form an enclosed waveguide. An example waveguide may have a continuous rectangular cross section having a width of from about 10 micrometers ($\mu$m) to about 500 $\mu$m and a height of from about 5 $\mu$m to about 100 $\mu$m. The interposer layer may have an overall thickness of from about 10 $\mu$m to about 200 $\mu$m.

In operation, a microwave launcher coupled to a first semiconductor die disposed proximate the interposer layer and a microwave launcher coupled to a second semiconductor die disposed proximate the interposer layer may bidirectionally exchange data via microwave signals transmitted via the waveguide formed in the interposer layer. In embodiments, such a system permits data exchange bandwidth well in excess of 100 GHz. Such represents an order of magnitude increase in performance over conventional microstrip and stripline-based communication systems.

A semiconductor package interposer layer with an integral waveguide is provided. The interposer layer may include: a waveguide member formed using a first material having a first relative permittivity; and a die member formed using a second material having a second relative permittivity, the die member disposed about at least a portion of an exterior perimeter of the waveguide member; wherein the first relative permittivity is greater than the second relative permittivity; and wherein the waveguide member and the die member form the interposer layer, the interposer layer having a planar first surface and a parallel, transversely opposed, planar second surface.

A method of fabricating a semiconductor package interposer layer with an integral waveguide is provided. The method may include: disposing an interposer die layer about at least a portion of an exterior perimeter of a waveguide member; wherein the waveguide member comprises a material having a first dielectric constant; wherein the interposer die layer comprises a material having a second dielectric constant, the second dielectric constant less than the first dielectric constant; wherein the waveguide member and the die member form the interposer layer, the interposer layer having a planar first surface and a parallel, transversely opposed, planar second surface.

A semiconductor package that includes an interposer layer with an integral waveguide is provided. The semiconductor package may include: a first semiconductor die communicably coupled via a first microwave launcher to a waveguide member and a second semiconductor die communicably coupled via second microwave launcher to the waveguide member. The interposer layer may include: a waveguide member formed using a first material having a first dielectric constant; and a die member formed using a second material having a second dielectric constant, the die member disposed about at least a portion of an exterior perimeter of the waveguide member; where the first dielectric constant is greater than the second dielectric constant; and where the waveguide member and the die member form the interposer layer, the interposer layer having a planar first surface and a parallel, transversely opposed, planar second surface.

A system for fabricating a semiconductor package interposer layer with an integral waveguide is provided. The system may include a means for disposing an interposer die layer about at least a portion of an exterior perimeter of a waveguide member; where the waveguide member comprises a material having a first dielectric constant; where the interposer die layer comprises a material having a second dielectric constant, the second dielectric constant less than the first dielectric constant; and where the waveguide member and the die member form the interposer layer, the interposer layer having a planar first surface and a parallel, transversely opposed, planar second surface.

An electronic device is provided. The electronic device may include: a printed circuit board; and a semiconductor package operably coupled to the printed circuit board. The semiconductor package may include: a waveguide member formed using a first material having a first dielectric constant; and a die member formed using a second material having a second dielectric constant, the die member disposed about at least a portion of an exterior perimeter of the waveguide member; wherein the first dielectric constant is greater than the second dielectric constant; and wherein the waveguide member and the die member form the interposer layer, the interposer layer having a planar first surface and a parallel, transversely opposed, planar second surface.

As used herein the terms "top," "bottom," "upper," "lower," "lowermost," and "uppermost" when used in relationship to one or more elements are intended to convey a relative rather than absolute physical configuration. Thus, an element described as an "upper film layer" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

As used herein, the term "logically associated" when used in reference to a number of objects, systems, or elements, is intended to convey the existence of a relationship between the objects, systems, or elements such that access to one object, system, or element exposes the remaining objects, systems, or elements having a "logical association" with or to the accessed object, system, or element. An example "logical association" exists between relational databases where access to an element in a first database may provide information and/or data from one or more elements in a number of additional databases, each having an identified relationship to the accessed element. In another example, if "A" is logically associated with "B," accessing "A" will expose or otherwise draw information and/or data from "B," and vice-versa.

Figure 1B:
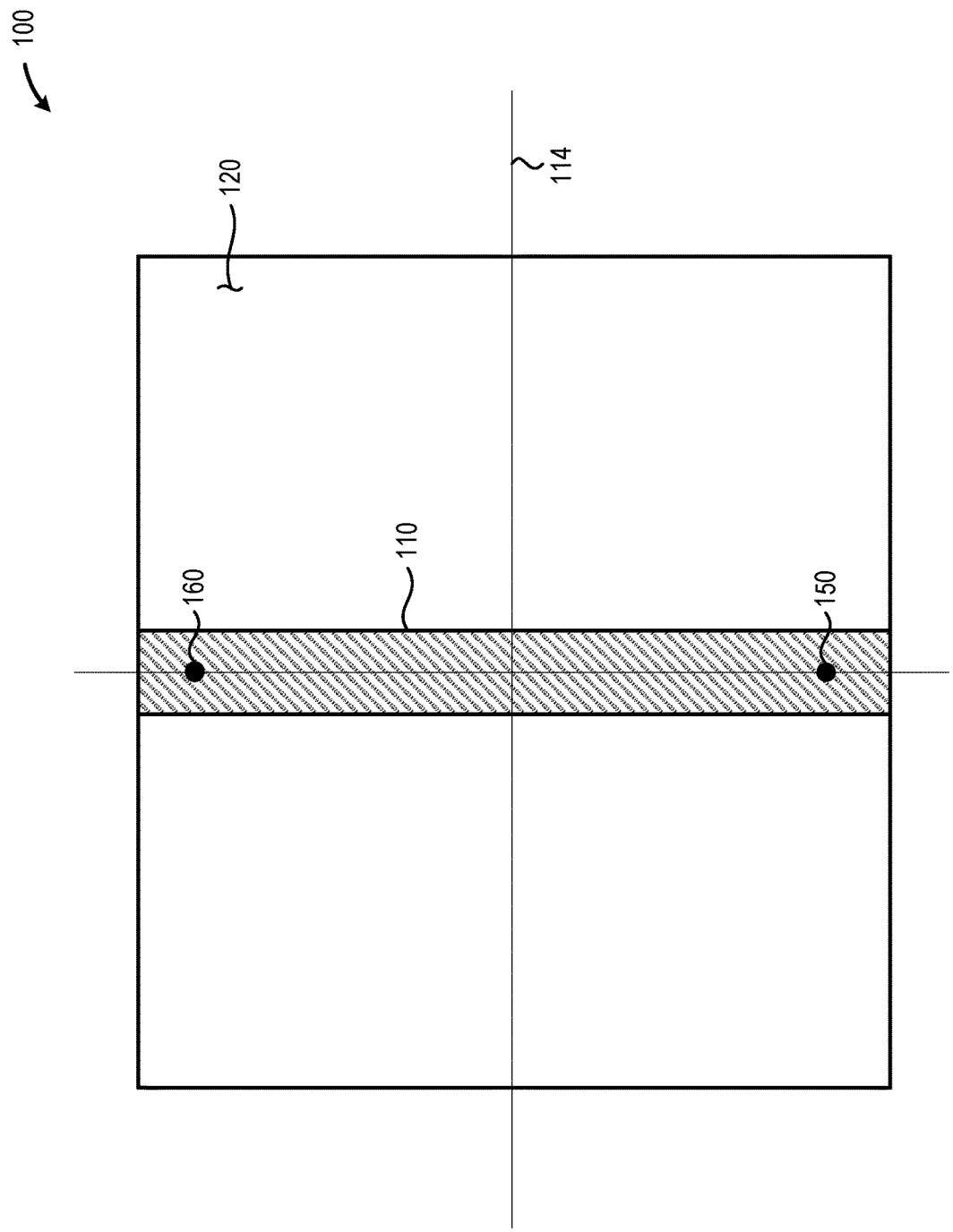
FIG. 1B is a cross-sectional plan view of the illustrative interposer layer depicted in FIG. 1A, along section line 1B-1B, in accordance with at least one embodiment described herein.

FIG. 1A is a perspective view of an illustrative interposer layer 100 with a waveguide 110, dielectric member 120, both sandwiched at least partially between an upper conductive sheet 130, and a lower conductive sheet 140, in accordance with at least one embodiment described herein. FIG. 1B is a cross-sectional plan view of the illustrative interposer layer 100 depicted in FIG. 1A, along section line 1B-1B, in accordance with at least one embodiment described herein. The waveguide member 110 may be fabricated from one or more materials having a relatively high relative permittivity compared to the relative permittivity of the dielectric member 120. A microwave signal generated by a semiconductor die stacked above or below the interposer layer 100 propagates along the waveguide member 110. The difference in relative permittivity between the waveguide member 110 and the dielectric member 120 causing the microwave signal to propagate within the waveguide member 110. The greater the relative permittivity difference between the waveguide member 110 and the dielectric member 120 the more favorable the conditions for microwave propagation along the waveguide member 110. Beneficially and advantageously, the available bandwidth using microwave propagation along the waveguide member 110 may exceed 100 GHz, 150 GHz, or even 200 GHz.

Although the interposer layer 100 depicted in FIGS. 1A and 1B includes only a waveguide member 110, the interposer layer 100 may include other structures in addition to one or more waveguide members 110. Such structures may include, but are not limited to: through vias; passive semiconductor components, microstrips, striplines, and combinations thereof.

Although only one waveguide member 110 is depicted in FIGS. 1A and 1B for clarity, those of skill in the relevant arts will readily appreciate that a plurality of waveguide members 110A-110$n$ may be similarly incorporated into an interposer layer 100. In embodiments, each of at least some of such a plurality of waveguide members 110A-110$n$ may be disposed parallel to each other. In embodiments, each of at least some of such a plurality of waveguide members 110A-110$n$ may be disposed perpendicular to each other. In embodiments, each of at least some of such a plurality of waveguide members 110A-110$n$ may be disposed skew to each other.

The waveguide member 110 may include any materials, construction, or combination of materials and/or construction to provide a member having a first relative permittivity. The dielectric member 120 may include any materials, construction, or combination of materials and/or construction to provide a member having a second relative permittivity. The first relative permittivity (of waveguide member 110) is greater than the second relative permittivity (of dielectric member 120). In embodiments, the waveguide member 110 may be fabricated using a single material, such as silicon nitride. In embodiments, the waveguide member 110 may include any material or combination of materials having a relative permittivity ($\varepsilon$) of greater than 7. Example materials include, but are not limited to: silicon nitride, metal nitrides, metal oxides, a pre-preg organic material, graphene, graphene oxides, and combinations thereof.

In embodiments, the waveguide member 110 includes a solid member fabricated using a combination of materials, such as a composite containing one or more solids suspended in a carrier material or such as a combination of two different compounds. In physical form, the waveguide member 110 may, in some embodiments, include a solid member having a density that is uniform throughout. In other embodiments, the waveguide member 110 may include a solid member having a variable density along one or more of the x-axis 114, y-axis 116, and/or z-axis 118. In embodiments, all or a portion of the waveguide member 110 may include a solid member with randomly sized and/or randomly distributed voids or spaces disposed in all or a portion of the waveguide member 110. In embodiments, all or a portion of the waveguide member 110 may include a solid member having regular and/or evenly distributed void spaces, for example a honeycomb-type material.

The waveguide member may be formed using any currently available or future developed material deposition method and/or process. Example material deposition processes include, but are not limited to: chemical vapor deposition, physical vapor deposition, atomic layer deposition, electroplating, electro-less plating, thin-film deposition, spin coating, or combinations thereof. In embodiments, the waveguide member 110 may be patterned or photolithographically deposited. Although depicted as a rectangular member in FIGS. 1A and 1B, the waveguide member 110 may have a circular, oval, or closed polygonal cross section. Although depicted as a single-segment, straight, waveguide aligned with the y-axis 116 in FIGS. 1A and 1B, the waveguide member 110 may include two or more straight waveguide segments connected by a curved waveguide segment. In embodiments, the waveguide member 110 may include two or more straight waveguide segments connected by a turn or bend.

The physical dimensions of the waveguide member 110 may be selected based, at least in part, on the expected operating frequency of the waveguide member 110. The height of the waveguide member 110 may be based, at least in part, on an allowable semiconductor package z-height. In embodiments, a rectangular waveguide member 110, such as depicted in FIGS. 1A and 1B, may have a width 112 of: about 10 micrometers ($\mu$m) or less; about 20 $\mu$m or less; about 30 $\mu$m or less; about 50 $\mu$m or less; about 100 $\mu$m or less; about 150 $\mu$m or less; about 200 $\mu$m or less; about 250 $\mu$m or less; or about 500 $\mu$m or less. In embodiments, a rectangular waveguide member, such as depicted in FIGS. 1A and 1B may have a height 122 of: about 10 micrometers ($\mu$m) or less; about 20 $\mu$m or less; about 30 $\mu$m or less; about 50 $\mu$m or less; about 100 $\mu$m or less; or about 250 $\mu$m or less.

The dielectric member 120 at least partially surrounds an exterior perimeter of the waveguide member 110. In embodiments, the waveguide member 110 and the dielectric member 120 together form a planar interposer layer having an upper surface and a lower surface. In embodiments, the dielectric layer 120 may extend completely about the exterior perimeter of the waveguide member 110. In embodiments, the dielectric layer 120 may be fabricated using a single material, such as silicon dioxide ($SiO_2$) having a second relative permittivity of approximately 4 at operating frequencies greater than 80 GHz. In embodiments, the dielectric member 120 may include any material or combination of materials having a second relative permittivity of less than 4. Example materials include, but are not limited to: silicon dioxide, porous silicon dioxide (Xerogels), highly porous silicon dioxide (aerogels), carbon doped oxides, black diamond, benzocyclobutene (BCB) based polymers, aromatic thermosetting polymers (ATP), hydrogen silequioxanes, poly arylene ethers (PAE), parylene, Teflon® AF, and combinations thereof. In embodiments, the difference between the first relative permittivity (of waveguide member 110) and the second relative permittivity (of dielectric member 120) may be greater than: about 3; about 5; about 7; about 10; or about 15.

In embodiments, the dielectric member 120 may include a solid member fabricated using a combination of materials, such as a composite containing one or more solids suspended in a carrier material. In physical form, the dielectric member 120 may, in some embodiments, include a member having a density that is relatively uniform throughout. In other embodiments, the dielectric member 120 may include a member having a variable density along one or more of the x-axis 114, y-axis 116, and/or z-axis 118. In embodiments, all or a portion of the dielectric member 120 may include a member having randomly sized and/or randomly distributed voids or spaces distributed throughout all or a portion of the dielectric member 120. In embodiments, all or a portion of the dielectric member 120 may include a member having regular and/or evenly distributed void spaces.

The dielectric member 120 may be formed using any currently available or future developed material deposition method and/or process. Example material deposition processes include, but are not limited to: chemical vapor deposition, physical vapor deposition, atomic layer deposition, electroplating, electro-less plating, thin-film deposition, spin coating, or combinations thereof. In embodiments, the dielectric member 120 may be patterned or photolithographically deposited.

The physical dimensions of the dielectric member 120 may be based, at least in part, on the size of the semiconductor die above the interposer layer 100 and/or the size of the semiconductor die disposed beneath the interposer layer 100. The height of the dielectric member 120 may be based, at least in part, on an allowable semiconductor package z-height. In embodiments, a dielectric layer 120, such as depicted in FIGS. 1A and 1B, may have a height 122 of: about 10 micrometers (μm) or less; about 20 μm or less; about 30 μm or less; about 50 μm or less; about 100 μm or less; or about 250 μm or less.

A first conductive sheet 130 may be disposed, in, on, about, or across all or a portion of the upper surface of the interposer layer formed by the waveguide member 110 and all or a portion of the dielectric member 120. Similarly, a second conductive sheet 140 may be disposed in, on, about, or across all or a portion of the lower surface of the interposer layer formed by the waveguide member 110 and all or a portion of the dielectric layer 120. The first conductive sheet 130 and the second conductive sheet 140 cover at least the waveguide member portion of the interposer layer formed by the waveguide member 110 and the dielectric member 120. In embodiments, the first conductive sheet 130 and the second conductive sheet 140 may cover all or a portion of the dielectric member portion of the interposer layer formed by the waveguide member 110 and the dielectric member 120.

The first conductive sheet 130 and the second conductive sheet 140 may be formed or fabricated from the same or different materials. The first conductive sheet 130 and the second conductive sheet 140 are formed using one or more electrically conductive materials, such as a copper, copper alloys, aluminum, aluminum alloys, conductive polymers, composites containing graphene and/or carbon fiber, and similar. In one embodiment, the first conductive sheet 130 and the second conductive sheet 140 may be formed using any currently available or future developed material deposition method and/or process. Example material deposition processes include, but are not limited to: chemical vapor deposition, physical vapor deposition, atomic layer deposition, electroplating, electro-less plating, thin-film deposition, spin coating, or combinations thereof. In embodiments, the first conductive sheet 130 and the second conductive sheet 140 may be patterned or photolithographically deposited in, on, about or across the upper and lower surfaces of the interposer layer.

The first conductive sheet 130 has a first thickness 132 and the second conductive sheet 140 has a second thickness 142. The first thickness 132 may be the same as or different from the second thickness 142. In embodiments, the first thickness 132 may be: less than about 2 micrometers (μm); less than about 5 μm; less than about 10 μm; less than about 15 μm; less than about 20 μm; less than about 25 μm; less than about 30 μm; less than about 40 μm; less than about 50 μm; less than about 70 μm; or less than about 100 μm. In embodiments, the second thickness 142 may be: less than about 10 micrometers (μm); less than about 15 μm; less than about 20 μm; less than about 25 μm; less than about 30 μm; less than about 40 μm; less than about 50 μm; less than about 70 μm; or less than about 100 μm.

The interposer layer 100 includes an aperture 150 disposed on the upper surface of the interposer layer 100 and proximate the waveguide member 110 to permit the insertion and/or operable coupling of a first microwave launcher assembly from a first semiconductor die disposed proximate the waveguide member 110. In at least one embodiment, the aperture 150 extends through the first conductive sheet 130 and penetrates at least partially through the waveguide member 110.

The interposer layer 100 includes an aperture 160 which may be disposed on either the upper surface or the lower surface of the interposer layer 100 in a location proximate the waveguide member 110 to permit the insertion and/or operable coupling of a second microwave launcher assembly from a second semiconductor die. In embodiments, the second semiconductor die may be disposed proximate the upper surface of the interposer layer 100 (i.e., a "side-by-side" semiconductor package). In such embodiments, the aperture 160 extends through the first conductive sheet 130 and penetrates at least partially through the waveguide member 110. In other embodiments, the second semiconductor die may be disposed proximate the lower surface of the interposer layer 100 (i.e., a "stacked-die" semiconductor package). In such embodiments, the aperture 160 extends through the second conductive sheet 140 and penetrates at least partially through the waveguide member 110.

Figure 2A:
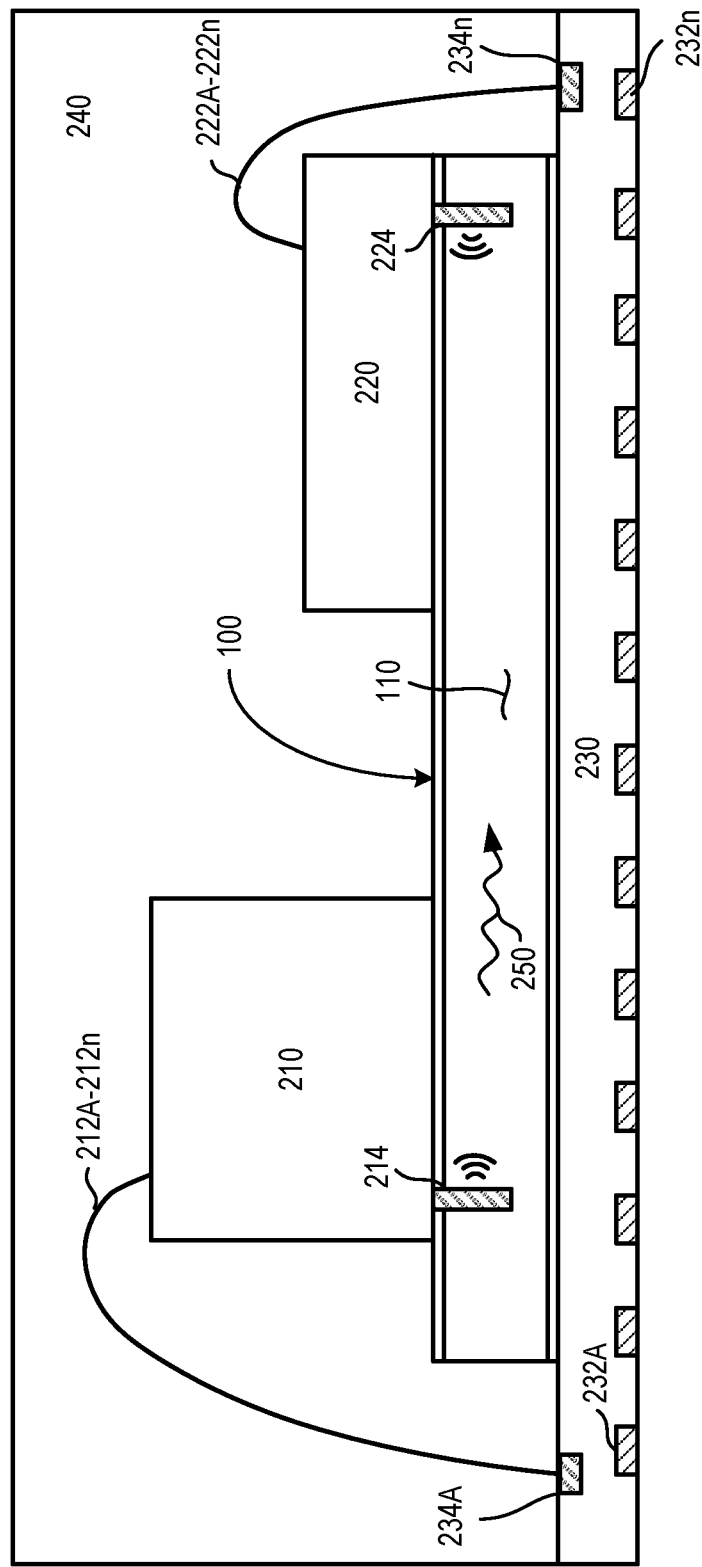
FIG. 2A is a cross-sectional elevation of an illustrative side-by-side semiconductor package that includes a first die and a second die that are communicably coupled by an interposer layer that includes a waveguide member, in accordance with at least one embodiment described herein.

FIG. 2A is a cross-sectional elevation of an illustrative side-by-side semiconductor package 200A that includes a first semiconductor die 210 and a second semiconductor die 220 disposed laterally with respect to each other and in which an interposer layer 100 that includes a waveguide member 110 serves as a "bridge" communicably coupling the first semiconductor die 210 with the second semiconductor die 220, in accordance with at least one embodiment described herein. As depicted in FIG. 2A, the first semiconductor die 210 includes a first microwave launcher assembly 214 that extends at least partially into the waveguide member 110. Similarly, the second semiconductor die 220 includes a second microwave launcher assembly 224 that extends at least partially into the waveguide member 110. The first semiconductor die 210 and the second semiconductor die 220 are both disposed on the upper surface of the interposer layer 100. The interposer layer 100 is disposed on the upper surface of a substrate 230 that includes a plurality of contact pads 232A-232n (collectively, "contact pads 232") disposed in, on, across, or about a lower surface of the substrate 230. The contact pads 232 permit the communicable coupling of the semiconductor package 200 to an external device, such as a printed circuit board.

A plurality of wirebonds 212A-212n (collectively, "wirebonds 212") communicably couple the first semiconductor package 210 to the substrate 230 via contact pads 234A-234n (collectively, "contact pads 234"). In some embodiments, a number of interposer vias may be used to communicably couple the first semiconductor package 210 to the substrate 230. A plurality of wirebonds 222A-222n (collectively, "wirebonds 222") communicably couple the second semiconductor package 220 to the substrate 230 via the contact pads 234. In some embodiments, a number of interposer vias may be used to communicably couple the second semiconductor package 220 to the substrate 230. An encapsulant 240 may be disposed about at least a portion of the die stack, including the waveguide interposer layer 110 that communicably couples the first semiconductor die 210 to the second semiconductor die 220.

In operation, the first semiconductor die 210 and the second semiconductor die 220 bidirectionally exchange information and/or data by emitting radio frequency and/or microwave frequency signals 250. In embodiments, the first semiconductor die 210 and the second semiconductor die 220 exchange data using microwave signals in the frequency range of from 30 GHz to about 900 GHz. In one or more embodiments, the first semiconductor die 210 and the second semiconductor die 220 exchange information and/or data 250 at frequencies of from about 50 GHz to about 200 GHz.

The first semiconductor die 210 and the second semiconductor die 220 may include any type and/or combination of semiconductor dies. For example, the first semiconductor die 210 and the second semiconductor die 220 may either or both include single semiconductor dies or may include stacked semiconductor dies. In one example, the first semiconductor die 210 and the second semiconductor die 220 may include a central processing unit (CPU) and a non-volatile memory such that the semiconductor package 200A comprises a system-on-a-chip (SoC). The first semiconductor die 210 and the second semiconductor die 220 may include, but are not limited to: a processor die, a controller die, a signal processor die, a graphical processing die, a NAND memory die; a three-dimensional NAND memory die, an IEEE 802.11 compliant communications die, or combinations thereof.

Figure 2B:
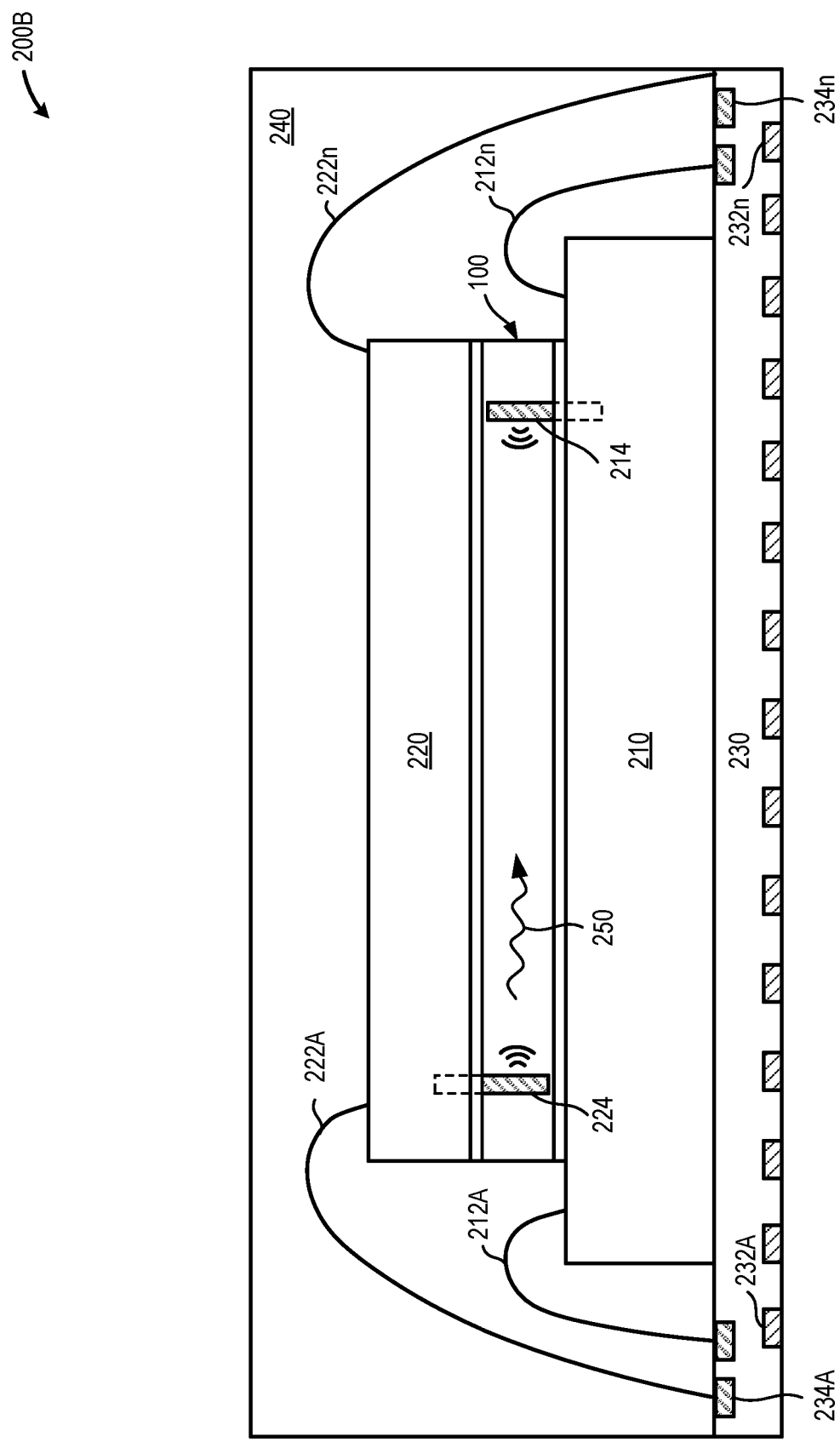
FIG. 2B is a crosssectional elevation of an illustrative semiconductor package that includes a first semiconductor die and second semiconductor die that are communicably coupled by an interposer layer that includes a waveguide member, in accordance with at least one embodiment described herein.

FIG. 2B is a cross-sectional elevation of an illustrative stacked-die semiconductor package 200B that includes a vertically stacked first semiconductor die 210 and a second semiconductor die 220 communicably coupled by an interposer layer 100 that includes a waveguide member 110, in accordance with at least one embodiment described herein. As depicted in FIG. 2B, the first semiconductor die 210 includes a first microwave launcher assembly 214 that extends at least partially into the waveguide member 110. Similarly, the second semiconductor die 220 includes a second microwave launcher assembly 224 that extends at least partially into the waveguide member 110. The first semiconductor die 210 is disposed on a substrate 230 that includes a plurality of contact pads 232A-232n (collectively, "contact pads 232") disposed in, on, across, or about a lower surface of the substrate 230.

Figure 2C:
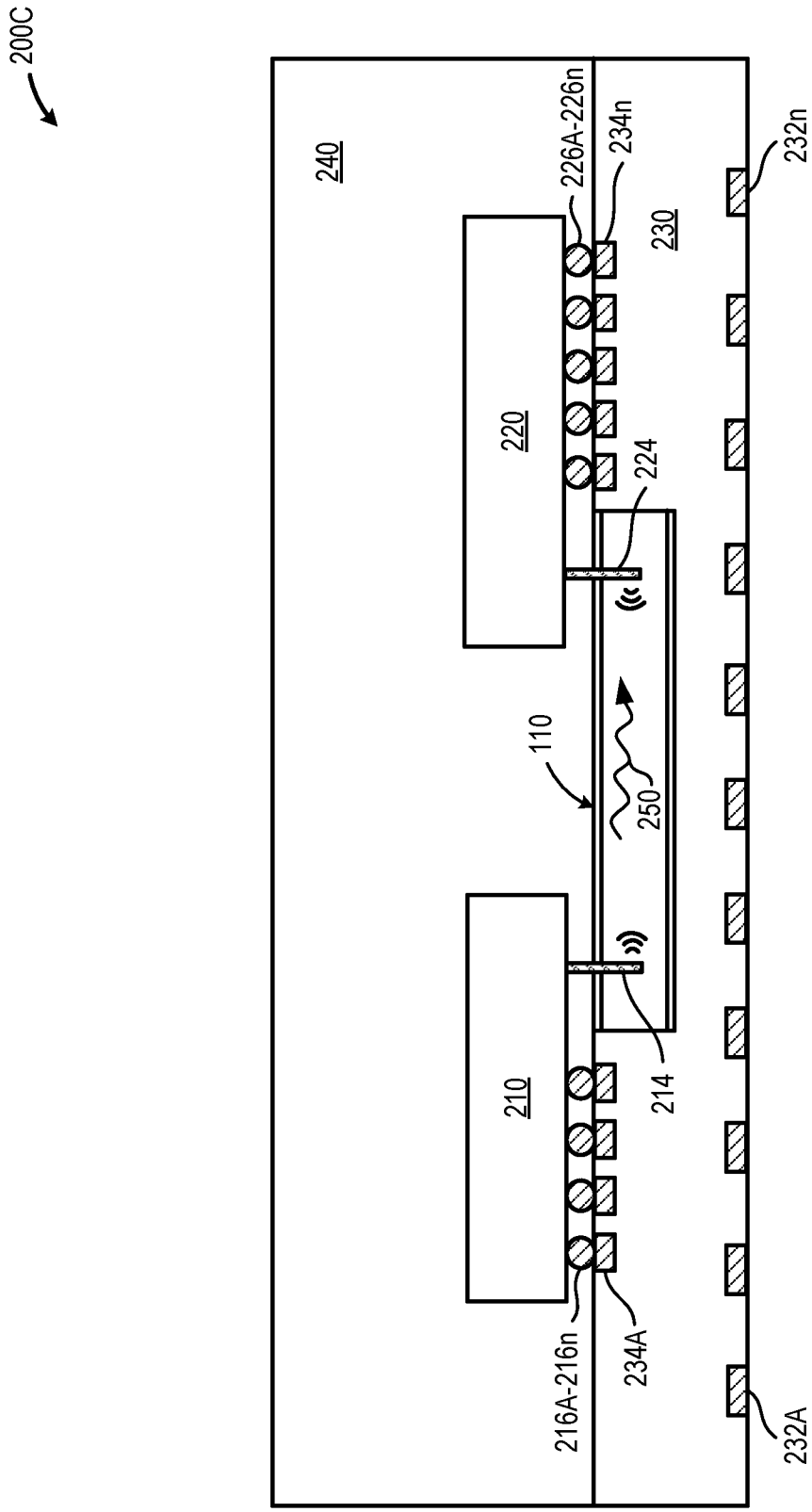
FIG. 2C is a cross-sectional elevation of an illustrative semiconductor package in which the waveguide is incorporated into the semiconductor package substrate and in which the waveguide bridges between the first semiconductor package and the second semiconductor package 220, in accordance with at least one embodiment described herein.

FIG. 2C is a cross-sectional elevation of an illustrative semiconductor package 200C in which the waveguide 110 is incorporated into the semiconductor package substrate 230 and in which the waveguide 110 bridges between the first semiconductor package 210 and the second semiconductor package 220, in accordance with at least one embodiment described herein. As depicted in FIG. 2C, the first semiconductor package 210 may be communicably coupled to the semiconductor package substrate 230 via a plurality of solder balls 216A-216n (collectively, "solder balls 216"). Also as depicted in FIG. 2C, the second semiconductor package 220 may be communicably coupled to the semiconductor package substrate 230 via a plurality of solder balls 226A-226n (collectively, "solder balls 226"). The waveguide 110 may be formed in the semiconductor package substrate 230 using any currently available or future developed material removal and/or material deposition techniques. In FIG. 2C, the semiconductor package substrate 230 provides the functionality of the interposer layer 100.

Figure 2D:
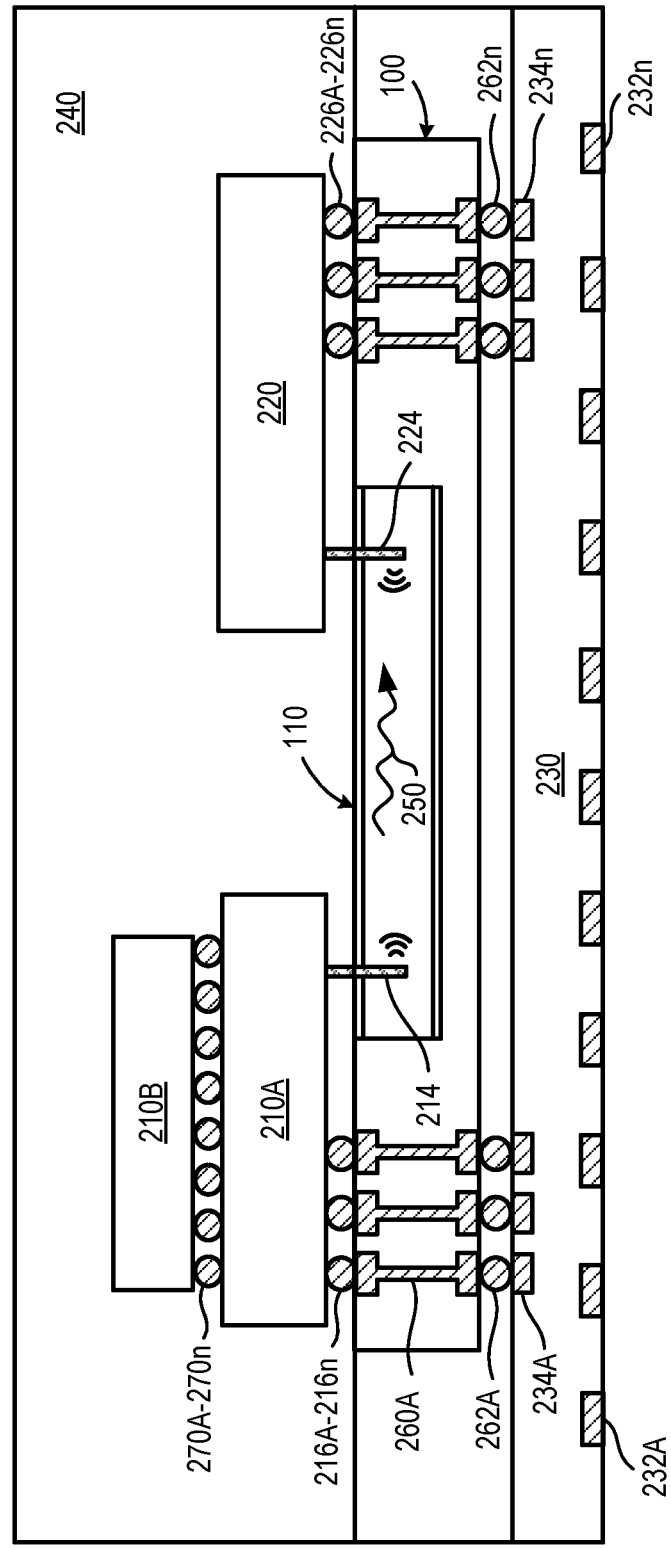
FIG. 2D is a cross-sectional elevation of an illustrative semiconductor package in which the interposer layer includes a waveguide that communicably couples the first semiconductor die with the second semiconductor die and a plurality of vias that communicably couple the first semiconductor die and the second semiconductor die to the semiconductor package substrate, in accordance with at least one embodiment described herein.

FIG. 2D is a cross-sectional elevation of an illustrative semiconductor package 200D in which the interposer layer 100 includes a waveguide 110 that communicably couples the first semiconductor die 210 with the second semiconductor die 220 and a plurality of vias 260A-260n (collectively, "vias 260") that communicably couple the first semiconductor die 210 and the second semiconductor die 220 to the semiconductor package substrate 230, in accordance with at least one embodiment described herein. As depicted in FIG. 2D, either or both the first semiconductor die 210 and/or the second semiconductor die 220 may include a stacked-die arrangement. In FIG. 2D, the first semiconductor die 210 includes two stacked dies 210A and 210B. As depicted in FIG. 2D, solder balls or similar conductive structures 270A-270n physically and/or communicably couple the semiconductor dies 210A and 210B in a die stack. In such embodiments, the stacked dies may be physically bonded and/or communicably coupled using any currently available or future developed physical bonding and/or communicable coupling methods or processes.

As depicted in FIG. 2D, in embodiments, the waveguide 110 may not completely traverse the interposer layer 100. In such embodiments, in at least a portion of the region of the interposer layer 100 that is not occupied by the waveguide 110, a number of vias 260 may be formed using any currently available or future developed via formation method or process. The vias 260 may then be used to communicably couple either or both the first semiconductor die 210 and/or the second semiconductor die 220 to the semiconductor package substrate 230. A plurality of solder balls or similar conductive structures 262A-262n communicably couple the interposer layer 100 to the semiconductor package substrate 230. A plurality of solder balls or similar conductive structures 216A-216n physically and/or communicably couple the first semiconductor die 210 to the interposer layer 100. A plurality of solder balls or similar conductive structures 226A-226n physically and/or communicably couple the second semiconductor die 220 to the interposer layer 100. In some embodiments, the waveguide 110 may be fabricated with the silicon bridge 100 prior to at least partially embedding or encapsulating the silicon bridge 100 in the package substrate 230.

Figure 2E:
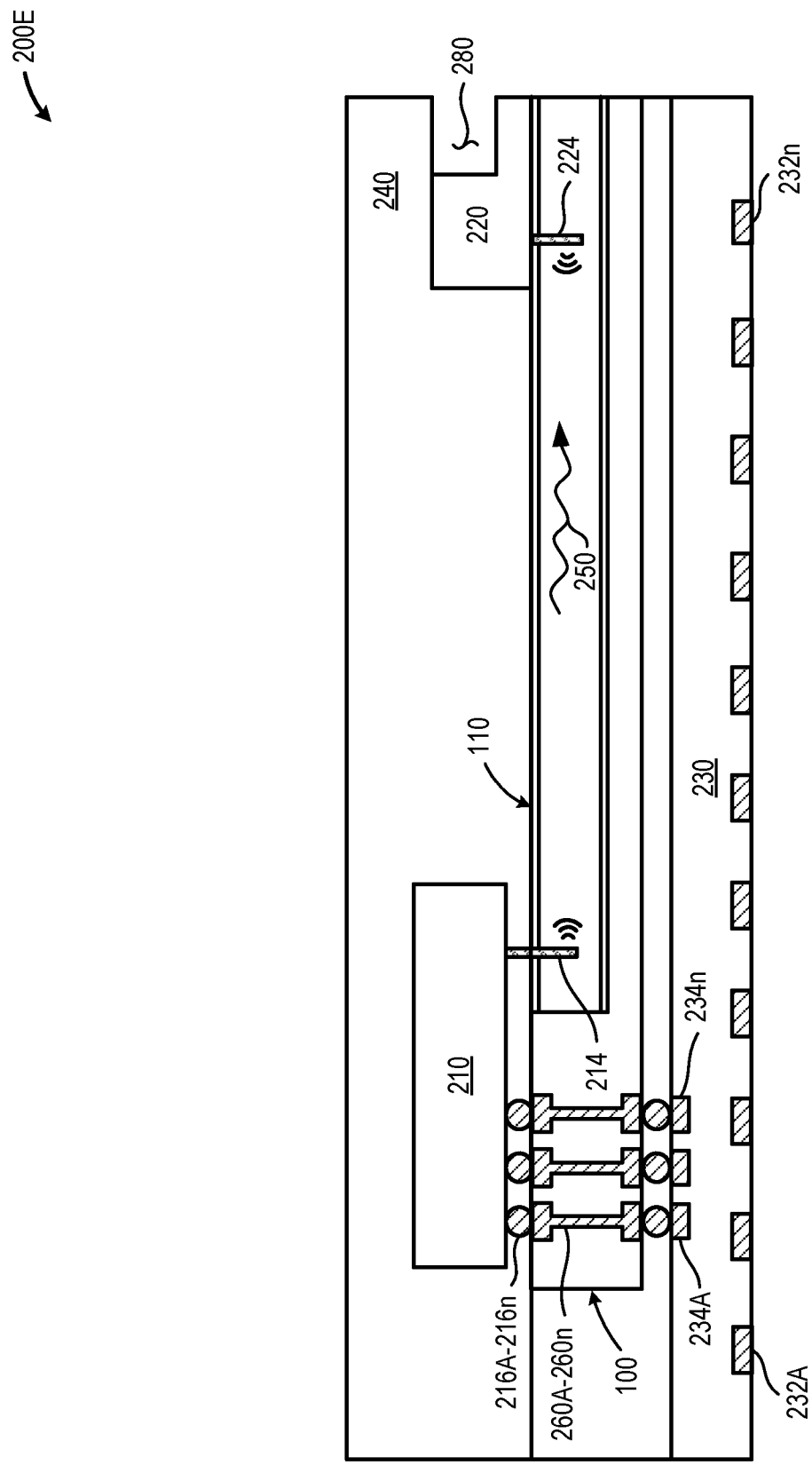
FIG. 2E is a cross-sectional elevation of an illustrative semiconductor package in which the interposer layer includes a waveguide to communicably couple a first semiconductor die with a second semiconductor die that includes an external port, and a plurality of vias communicably couple the first semiconductor die to the semiconductor package substrate, in accordance with at least one embodiment described herein.

FIG. 2E is a cross-sectional elevation of an illustrative semiconductor package 200E in which the interposer layer 100 includes a waveguide 110 to communicably couple the first semiconductor die 210 with a second semiconductor die 220 that includes an external port 280, and a plurality of vias 260A-260n (collectively, "vias 260") communicably couple the first semiconductor die 210 to the semiconductor package substrate 230, in accordance with at least one embodiment described herein. In embodiments, the second semiconductor die 220 may include one or more transceivers that communicably the waveguide 110 to one or more external communications channels, such as a cable or external waveguide member. In some embodiments the semiconductor die 220 may be replaced with a modular cable connector or similar device that communicably couples an external device such as a cable to the waveguide launcher 224. In some embodiments, the semiconductor die 220 may be replaced with a cable or similar device affixed to the waveguide launcher 224, for example by soldering the cable to the waveguide launcher 224. In some embodiments, the waveguide 110 may be fabricated with the silicon bridge 100 prior to at least partially embedding or encapsulating the silicon bridge 100 in the package substrate 230.

Figure 3:
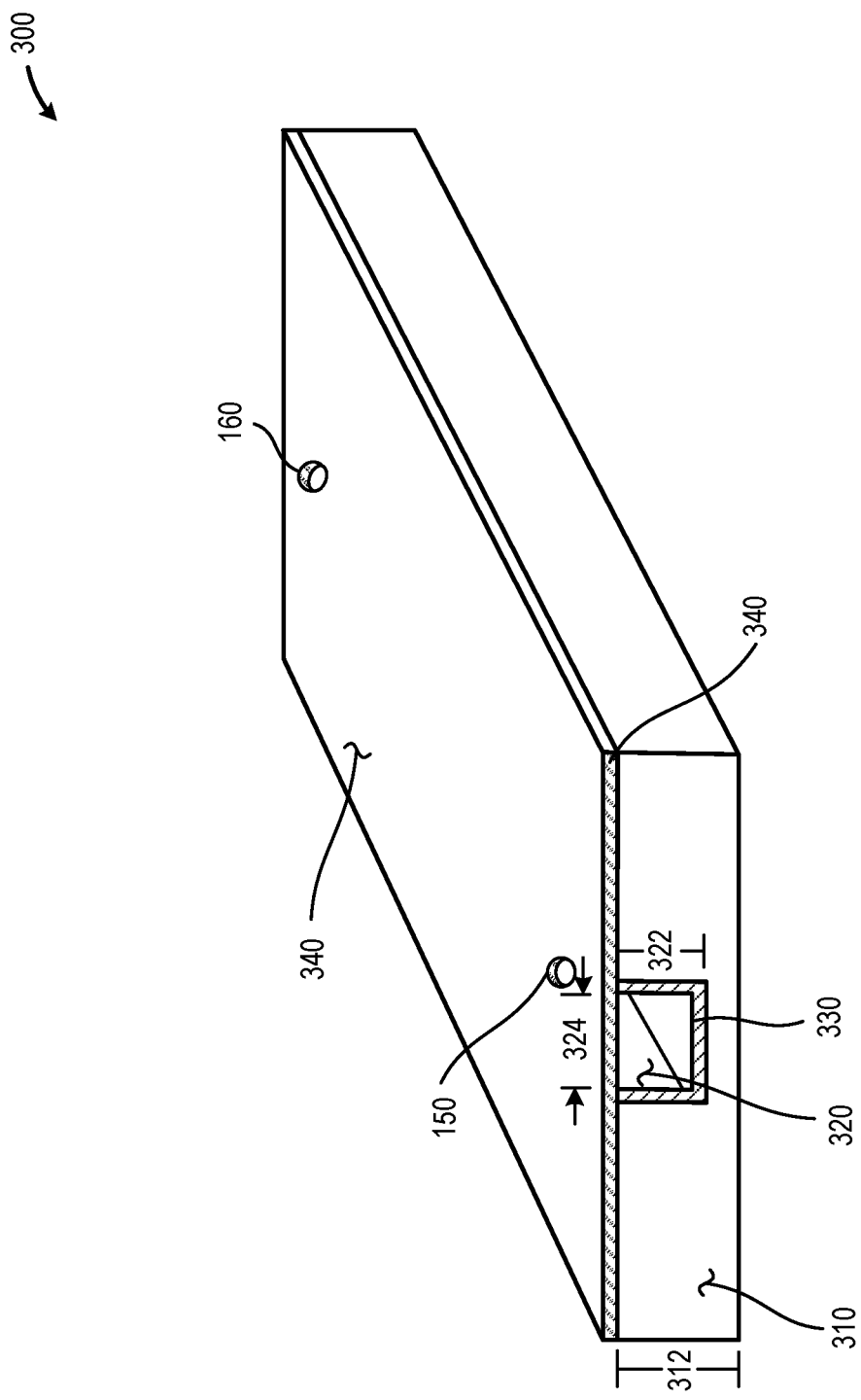
FIG. 3 is a perspective view of another illustrative interposer layer having an integrated waveguide, in accordance with at least one embodiment described herein.

FIG. 3 is a perspective view of another illustrative interposer layer 300 having an integrated waveguide, in accordance with at least one embodiment described herein. As depicted in FIG. 3, a channel 320 may be formed in a substrate member 310. A conductive layer 330 may be disposed in, on, about, or across at least a portion of the channel 320. A conductive sheet 340 may be disposed in, on, about, or across at least a portion of the upper surface of the substrate member 310. In some embodiments, a plurality of vias may form at least a portion of the conductive layer 330 disposed in the channel 320.

The substrate member 310 may include one or more dielectric materials. In some implementations, a silicon wafer may form or otherwise provide all or a portion of the substrate member 310. The substrate member 310 may have a thickness 312 of: less than about 10 micrometers (μm); less than about 20 μm; less than about 50 μm; less than about 75 μm; less than about 100 μm; less than about 150 μm; less than about 200 μm; less than about 300 μm; or less than about 600 μm. The thickness 312 of the substrate member 310 may be based, at least in part, on an allowable z-height for the finished semiconductor package in which the interposer layer 300 is disposed. The length and width of the substrate member 310 may be based, at least in part, on the footprint dimensions of the semiconductor die disposed above the interposer layer 300 and/or the footprint dimensions of the semiconductor die disposed beneath the interposer layer 300.

The channel 320 may be formed in the substrate member 310 using any currently available or future developed material removal process or method. Example material removal methods may include, but are not limited to: mask and etch, laser ablation, and mechanical grinding or saw cutting. The physical dimensions of the channel 320 may be selected based, at least in part, on the expected operating frequency semiconductor dies disposed above and below the interposer layer 300. The depth of the channel 320 may be based, at least in part, on an allowable semiconductor package z-height. In embodiments, the channel 320 depicted in FIG. 3 may have a depth 322 of: about 10 micrometers (μm) or less; about 20 μm or less; about 30 μm or less; about 50 μm or less; about 100 μm or less; or about 250 μm or less. In embodiments, a channel 320 such as depicted in FIG. 3, may have a width 324 of: about 10 micrometers (μm) or less; about 20 μm or less; about 30 μm or less; about 50 μm or less; about 100 μm or less; about 150 μm or less; about 200 μm or less; about 250 μm or less; or about 500 μm or less.

The conductive layer 330 lining the channel may be deposited using any currently available of future developed material deposition process or method. The conductive layer 330 may include one or more electrically conductive materials, such as copper, copper alloys, aluminum, aluminum alloys, conductive polymers, or combinations thereof. Example material deposition techniques include, but are not limited to, chemical vapor deposition, physical vapor deposition, atomic layer deposition, electroplating, sputtering, and similar. In embodiments, the conductive layer 330 may have a thickness of: less than about 2 micrometers (μm); less than about 5 μm; less than about 10 μm; less than about 20 μm; less than about 30 μm; less than about 40 μm; less than about 50 μm; less than about 70 μm; or less than about 100 μm.

In some implementations, the conductive layer 330 may be deposited across the entire upper surface of the interposer layer 300. In such implementations, all or a portion of the conductive layer deposited external to the channel 320 may be removed using one or more material removal processes or methods. For example, the conductive layer 330 may be removed via chemical/mechanical planarization or grinding.

In some implementations, although not depicted in FIG. 3, after the deposition of the conductive layer 330 a dielectric material may be deposited in the interior space in the channel 320. In embodiments, the dielectric material may completely fill the channel 320. In other embodiments, the dielectric material may only partially fill the channel 320.

The conductive sheet 340 may be disposed, in, on, about, or across all or a portion of the upper surface of the interposer layer 300. The conductive sheet 340 covers at least the channel 320 formed in the interposer layer 300. The conductive sheet 340 is formed using one or more electrically conductive materials, such as a copper, copper alloys, aluminum, aluminum alloys, conductive polymers, composites containing graphene and/or carbon fiber, and similar. The conductive sheet 340 may be formed using any currently available or future developed material deposition method and/or process. Example material deposition processes include, but are not limited to: chemical vapor deposition, physical vapor deposition, atomic layer deposition, electroplating, electro-less plating, thin-film deposition, spin coating, or combinations thereof. The conductive sheet 340 may have a thickness of: less than about 2 micrometers (μm); less than about 5 μm; less than about 10 μm; less than about 15 μm; less than about 20 μm; less than about 25 μm; less than about 30 μm; less than about 40 μm; less than about 50 μm; less than about 70 μm; or less than about 100 μm. The conductive sheet 340 may be permanently affixed to the upper surface of the interposer layer 300.

Figure 4:
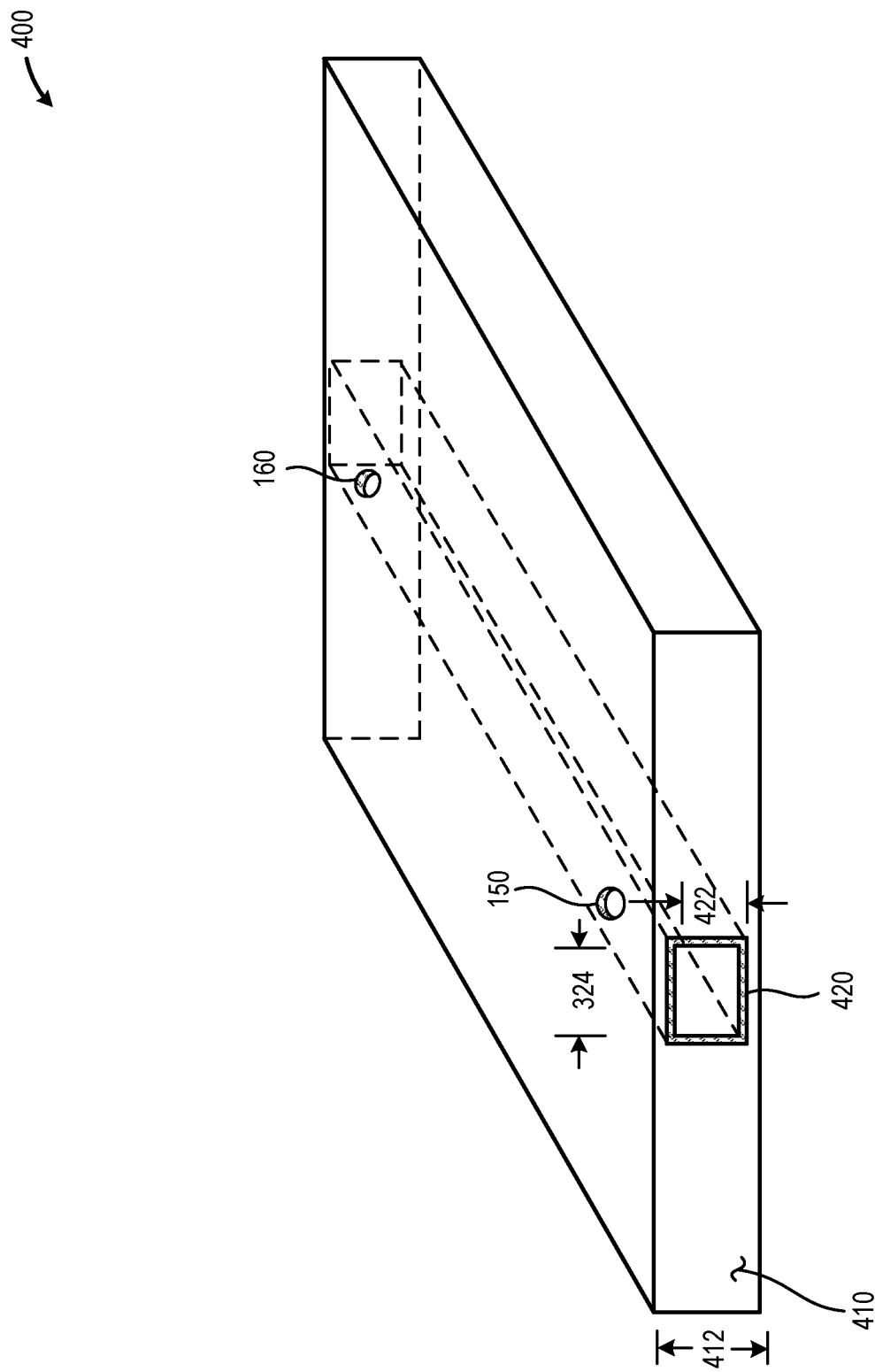
FIG. 4 is a perspective view of another illustrative interposer layer having a substrate member that partially or completely surrounds an exterior perimeter of an integrated hollow waveguide member, in accordance with at least one embodiment described herein.

FIG. 4 is a perspective view of another illustrative interposer layer 400 having a substrate member 410 that partially or completely surrounds an exterior perimeter of an integrated hollow waveguide member 420, in accordance with at least one embodiment described herein. The hollow waveguide member 420 may include a conductive tube having any cross sectional geometry, including but not limited to: rectangular, oval, circular, or any regular or irregularly shaped closed polygon.

The substrate member 410 may include one or more dielectric materials. In some implementations, a silicon wafer may form or otherwise provide all or a portion of the substrate member 410. The substrate member 410 may have a thickness 412 of: less than about 10 micrometers (μm); less than about 20 μm; less than about 50 μm; less than about 75 μm; less than about 100 μm; less than about 150 μm; less than about 200 μm; less than about 300 μm; or less than about 600 μm. The thickness 412 of the substrate member 410 may be based, at least in part, on an allowable z-height for the finished semiconductor package in which the interposer layer 400 is disposed. The length and width of the substrate member 410 may be based, at least in part, on the footprint dimensions of the semiconductor die disposed above the interposer layer 400 and/or the footprint dimensions of the semiconductor die disposed beneath the interposer layer 400.

The hollow waveguide member 420 may include any electrically conductive or non-conductive waveguide member. In some implementations, all or a portion of the hollow waveguide member 420 may be at least partially filled with a dielectric material. The physical dimensions of the hollow waveguide member 420 may be selected based, at least in part, on the expected operating frequency semiconductor dies disposed above and below the interposer layer 400. The depth of the hollow waveguide member 420 may be based, at least in part, on an allowable semiconductor package z-height. In embodiments, the hollow waveguide member 420 depicted in FIG. 4 may have a height 422 of: about 10 micrometers (μm) or less; about 20 μm or less; about 30 μm or less; about 50 μm or less; about 100 μm or less; or about 250 μm or less. In embodiments, the hollow waveguide member 420 such as depicted in FIG. 4, may have a width 424 of: about 10 micrometers (μm) or less; about 20 μm or less; about 30 μm or less; about 50 μm or less; about 100 μm or less; about 150 μm or less; about 200 μm or less; about 250 μm or less; or about 500 μm or less.

Figure 5:
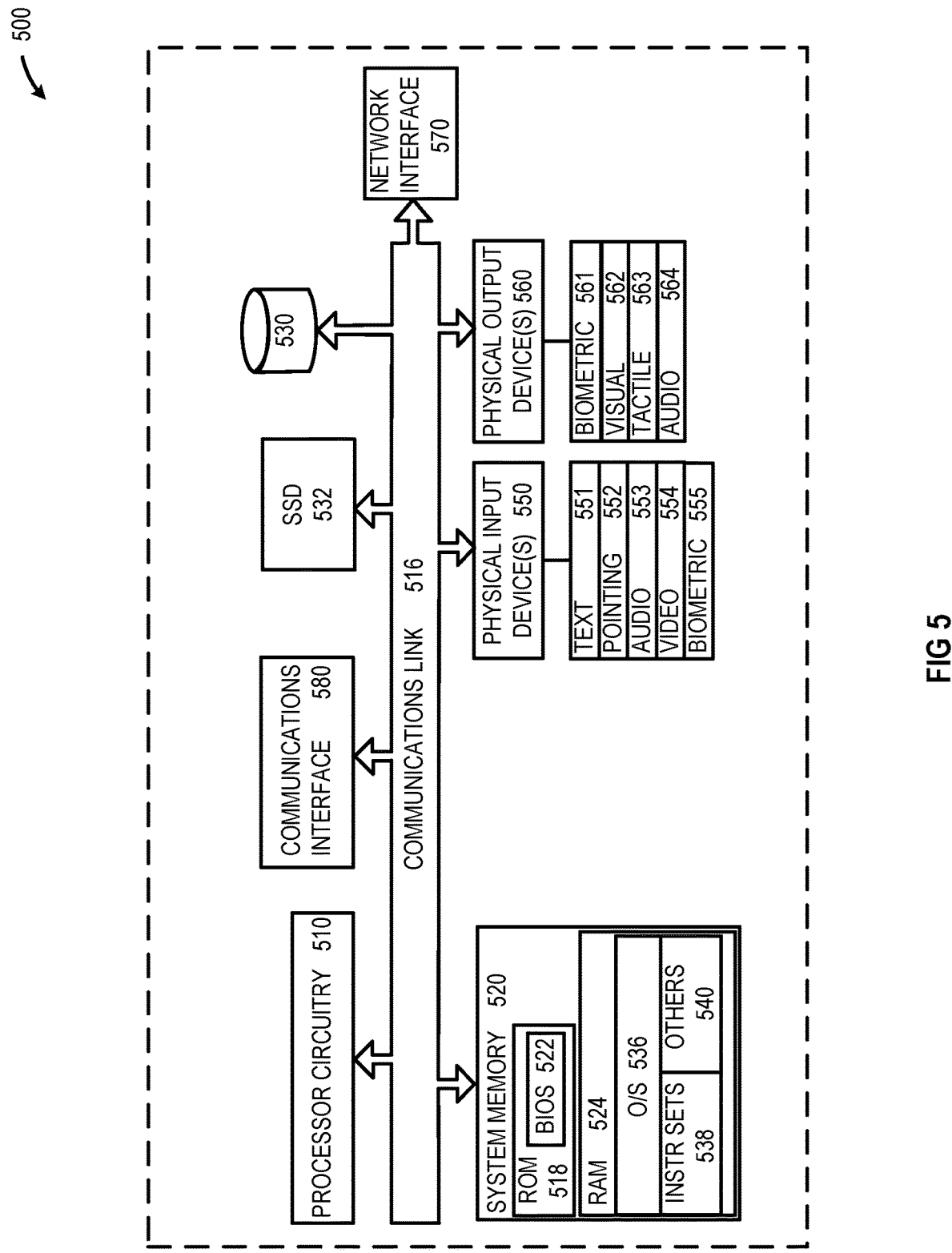
FIG. 5 is a block diagram of an illustrative processor-based device equipped with at least one semiconductor package that includes at least one interposer layer incorporating a waveguide such as described above with regard to FIGS. 1A through 4, in accordance with at least one embodiment described herein.

FIG. 5 is a block diagram of an illustrative processor-based device 500 equipped with a semiconductor package that includes at least one interposer layer containing a waveguide such as described above with regard to FIGS. 1A through 4, in accordance with at least one embodiment described herein. The following discussion provides a brief, general description of the components forming the illustrative processor-based device 500 such as a smartphone, wearable computing device, portable computing device, or similar device using a semiconductor package that includes an interposer layer having an integral waveguide to facilitate communication between a first semiconductor die 210 and a second semiconductor die 220 and having the features depicted in any of FIG. 1A, 1B, 3, or 4.

The processor-based device 500 includes processor circuitry 510 capable of executing machine-readable instruction sets, reading data from a storage device 530 and writing data to the storage device 530. Those skilled in the relevant art will appreciate that the illustrated embodiments as well as other embodiments can be practiced with other circuit-based device configurations, including portable electronic or handheld electronic devices, for instance smartphones, portable computers, wearable computers, microprocessor-based or programmable consumer electronics, personal computers ("PCs"), network PCs, minicomputers, mainframe computers, and the like.

The processor circuitry 510 may include any number of hardwired or configurable circuits, some or all of which may include programmable and/or configurable combinations of electronic components, semiconductor devices, and/or logic elements that are disposed partially or wholly in a PC, server, or other computing system capable of executing machine-readable instructions. The processor-based device 500 includes the processor circuitry 510 and bus or similar communications link 516 that communicably couples and facilitates the exchange of information and/or data between various system components including a system memory 520, one or more rotating data storage devices 530, and/or one or more solid state storage devices 532. The processor-based device 500 may be referred to in the singular herein, but this is not intended to limit the embodiments to a single device and/or system, since in certain embodiments, there will be more than one processor-based device 500 that incorporates, includes, or contains any number of communicably coupled, collocated, or remote networked circuits or devices.

The processor circuitry 510 may include any number, type, or combination of devices. At times, the processor circuitry 510 may be implemented in whole or in part in the form of semiconductor devices such as diodes, transistors, inductors, capacitors, and resistors. Such an implementation may include, but is not limited to any current or future developed single- or multi-core processor or microprocessor, such as: on or more systems on a chip (SOCs); central processing units (CPUs); digital signal processors (DSPs); graphics processing units (GPUs); application-specific integrated circuits (ASICs), programmable logic units, field programmable gate arrays (FPGAs), and the like. Unless described otherwise, the construction and operation of the various blocks shown in FIG. 5 are of conventional design. Consequently, such blocks need not be described in further detail herein, as they will be understood by those skilled in the relevant art. The communications link 516 that interconnects at least some of the components of the processor-based device 500 may employ any known serial or parallel bus structures or architectures.

The system memory 520 may include read-only memory ("ROM") 518 and random access memory ("RAM") 524. A portion of the ROM 518 may be used to store or otherwise retain a basic input/output system ("BIOS") 522. The BIOS 522 provides basic functionality to the processor-based device 500, for example by causing the processor circuitry 510 to load one or more machine-readable instruction sets. In embodiments, at least some of the one or more machine-readable instruction sets cause at least a portion of the processor circuitry 510 to provide, create, produce, transition, and/or function as a dedicated, specific, and particular machine, for example a word processing machine, a digital image acquisition machine, a media playing machine, a communications device, and similar.

The processor-based device 500 may include one or more communicably coupled, non-transitory, data storage devices, such as one or more hard disk drives 530 and/or one or more solid-state storage devices 532. The one or more data storage devices 530 may include any current or future developed storage appliances, networks, and/or devices. Non-limiting examples of such data storage devices 530 may include, but are not limited to, any current or future developed non-transitory storage appliances or devices, such as one or more magnetic storage devices, one or more optical storage devices, one or more electro-resistive storage devices, one or more molecular storage devices, one or more quantum storage devices, or various combinations thereof. In some implementations, the one or more data storage devices 530 may include one or more removable storage devices, such as one or more flash drives, flash memories, flash storage units, or similar appliances or devices capable of communicable coupling to and decoupling from the processor-based device 500.

The one or more data storage devices 530 and/or the one or more solid-state storage devices 532 may include interfaces or controllers (not shown) communicatively coupling the respective storage device or system to the communications link 516. The one or more data storage devices 530 may store, retain, or otherwise contain machine-readable instruction sets, data structures, program modules, data stores, databases, logical structures, and/or other data useful to the processor circuitry 510 and/or one or more applications executed on or by the processor circuitry 510. In some instances, one or more data storage devices 530 may be communicably coupled to the processor circuitry 510, for example via communications link 516 or via one or more wired communications interfaces (e.g., Universal Serial Bus or USB); one or more wireless communications interfaces (e.g., Bluetooth®, Near Field Communication or NFC); one or more wired network interfaces (e.g., IEEE 802.3 or Ethernet); and/or one or more wireless network interfaces (e.g., IEEE 802.11 or WiFi®).

Machine-readable instruction sets 538 and other programs, applications, logic sets, and/or modules 540 may be stored in whole or in part in the system memory 520. Such instruction sets 538 may be transferred, in whole or in part, from the one or more data storage devices 530 and/or the solid state storage device 532. The instruction sets 538 may be loaded, stored, or otherwise retained in system memory 520, in whole or in part, during execution by the processor circuitry 510. The machine-readable instruction sets 538 may include machine-readable and/or processor-readable code, instructions, or similar logic capable of providing the speech coaching functions and capabilities described herein.

A system user may provide, enter, or otherwise supply commands (e.g., selections, acknowledgements, confirmations, and similar) as well as information and/or data (e.g., subject identification information, color parameters) to the processor-based device 500 using one or more communicably coupled input devices 550. The one or more communicably coupled input devices 550 may be disposed local to or remote from the processor-based device 500. The input devices 550 may include one or more: text entry devices 551 (e.g., keyboard); pointing devices 552 (e.g., mouse, trackball, touchscreen); audio input devices 553; video input devices 554; and/or biometric input devices 555 (e.g., fingerprint scanner, facial recognition, iris print scanner, voice recognition circuitry). In embodiments, at least some of the one or more input devices 550 may include a wired or wireless interface that communicably couples the input device 550 to the processor-based device 500.

The system user may receive output from the processor-based device 500 via one or more output devices 560. In at least some implementations, the one or more output devices 560 may include, but are not limited to, one or more: biometric output devices 561; visual output or display devices 562; tactile output devices 563; audio output devices 564, or combinations thereof. In embodiments, at least some of the one or more output devices 560 may include a wired or a wireless communicable coupling to the processor-based device 502.

For convenience, a network interface 570, the processor circuitry 510, the system memory 520, the one or more input devices 550 and the one or more output devices 560 are illustrated as communicatively coupled to each other via the communications link 516, thereby providing connectivity between the above-described components. In alternative embodiments, the above-described components may be communicatively coupled in a different manner than illustrated in FIG. 5. For example, one or more of the above-described components may be directly coupled to other components, or may be coupled to each other, via one or more intermediary components (not shown). In some embodiments, all or a portion of the communications link 516 may be omitted and the components are coupled directly to each other using suitable wired or wireless connections.

Figure 6:
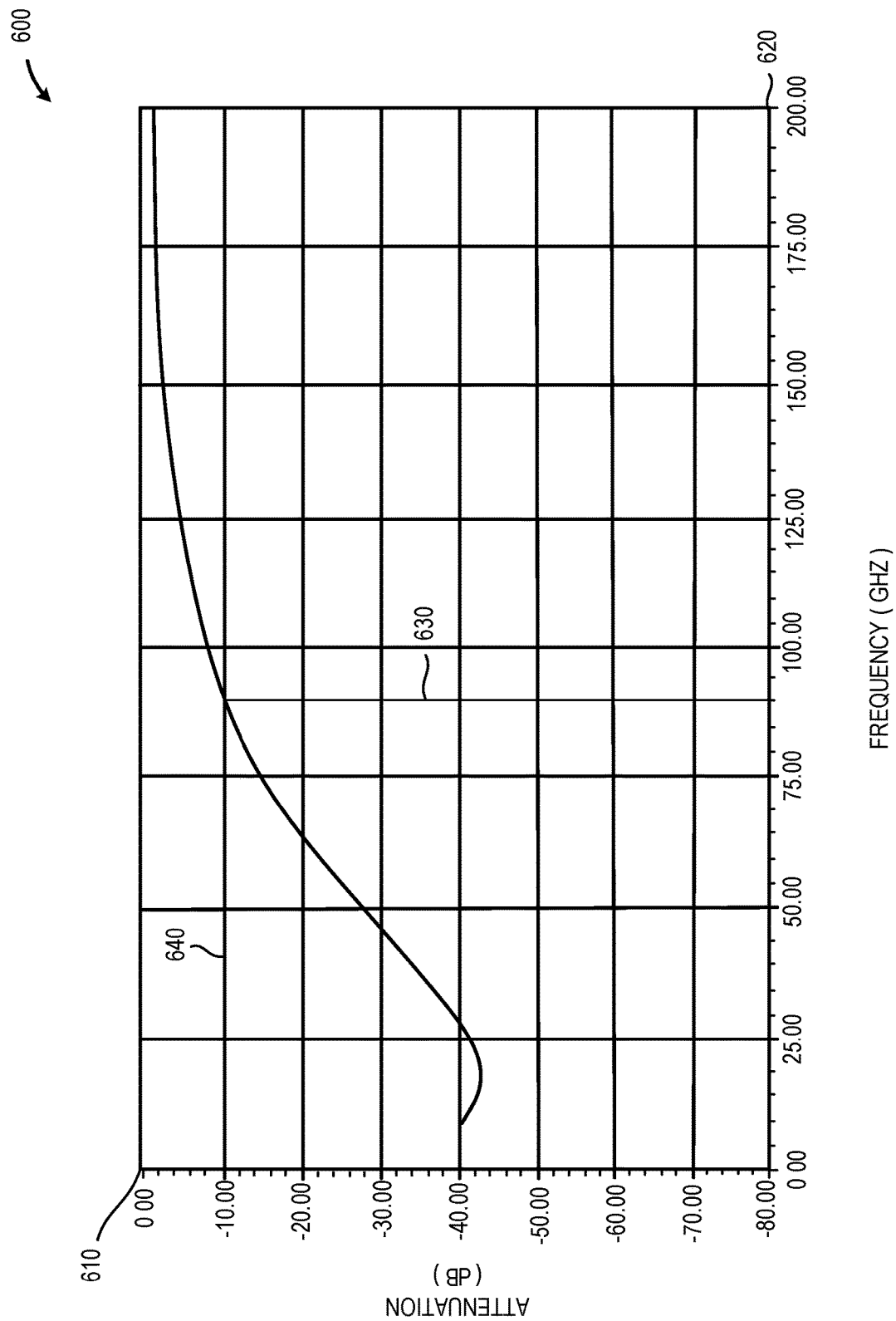
FIG. 6 is a graph of a calculated hypothetical signal attenuation (in dB) against signal frequency (in GHz) for a first interposer layer construction such as depicted in FIGS. 1A and 1B, in accordance with at least one embodiment described herein.

FIG. 6 is a graph 600 of a calculated hypothetical signal attenuation (in dB) 610 against signal frequency 620 (in GHz) for a first interposer layer construction such as depicted in FIGS. 1A and 1B, in accordance with at least one embodiment described herein. The interposer layer 100 used in generating the graph 600 includes a silicon nitride waveguide member 110 that is 60 micrometers (µm) high, 150 µm wide, and 10 millimeters (mm) in length. The dielectric member 120 has a height of 60 µm. The first conductive sheet 130 and the second conductive sheet 140 are of equal thickness, 20 µm. As depicted in FIG. 6, at transmission frequency 630 of approximately 80 GHz, signal attenuation 640 drops to 10 decibels (dB) and remains below 10 dB through transmission frequencies of up to 200 GHz.

Figure 7:
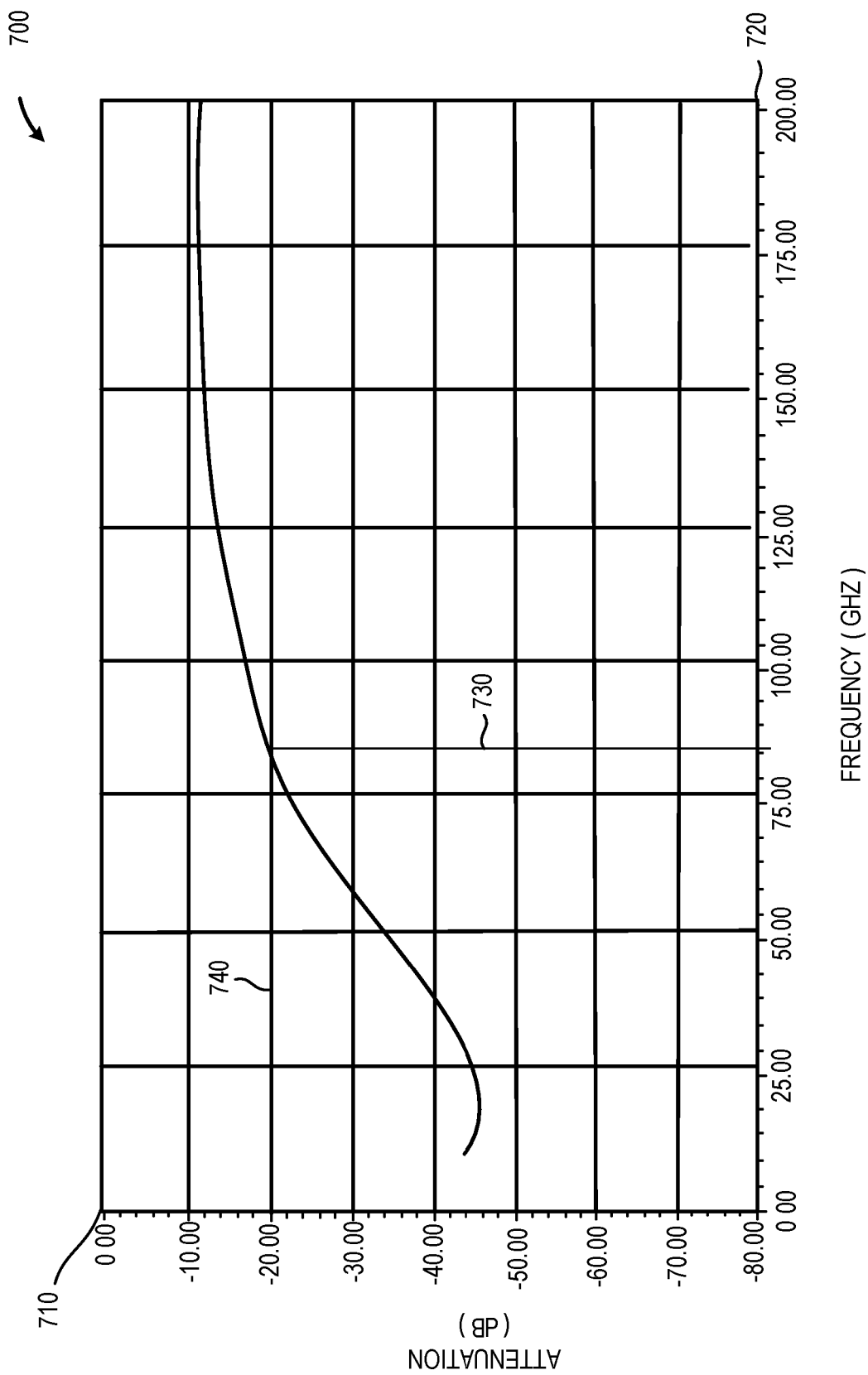
FIG. 7 is a graph of a calculated hypothetical signal attenuation (in dB) against signal frequency (in GHz) for a second interposer layer construction such as depicted in FIGS. 1A and 1B, in accordance with at least one embodiment described herein.

FIG. 7 is a graph 700 of a calculated hypothetical signal attenuation (in dB) 710 against signal frequency 720 (in GHz) for a second interposer layer construction such as depicted in FIGS. 1A and 1B, in accordance with at least one embodiment described herein. The interposer layer 100 used in generating the graph 700 includes a silicon nitride waveguide member 110 that is 6 micrometers (µm) high, 15 µm wide, and 10 millimeters (mm) in length. The dielectric member 120 has a height of 6 µm. The first conductive sheet 130 and the second conductive sheet 140 are of equal thickness, 2 µm. As depicted in FIG. 7, at transmission frequency 730 of approximately 80 GHz, signal attenuation 740 is approximately 20 decibels (dB) and remains below 20 dB through transmission frequencies of up to 200 GHz.

Figure 8:
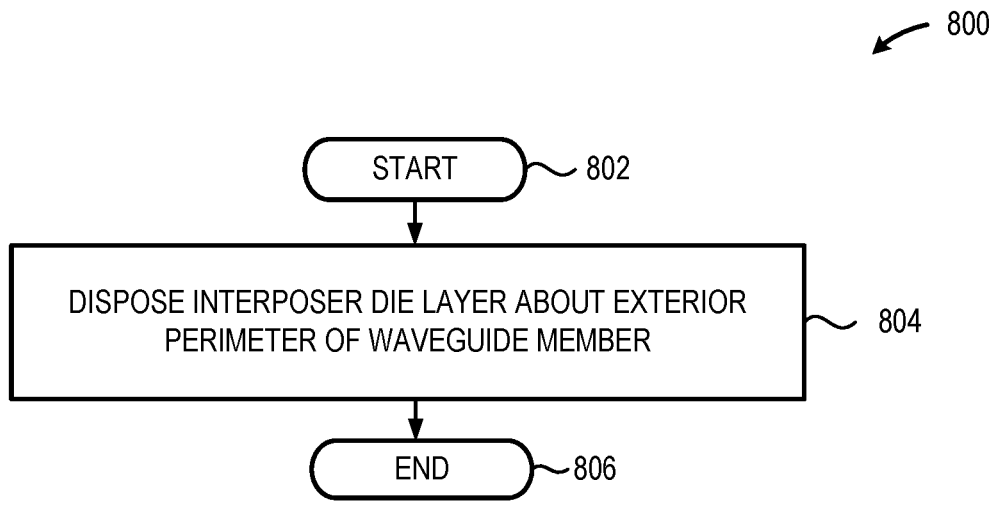
FIG. 8 is a high-level logic flow diagram of an illustrative method of forming an interposer layer that includes an integral microwave waveguide member, in accordance with at least one embodiment described herein.

FIG. 8 is a high-level logic flow diagram of an illustrative method of forming an interposer layer 100 that includes an integral microwave waveguide member 110, in accordance with at least one embodiment described herein. As inter-die communications speeds increase above those reliably sustainable using microstrips and/or striplines, microwave communication through a die stack using interposer layers having integral waveguides provide a cost-effective and reliable alternative. The method 800 commences at 802.

At 804, a dielectric layer 120 is disposed at least partially about an exterior perimeter of a waveguide member 110. The waveguide member 110 is formed using a material or materials having a first relative permittivity and the interposer layer 120 is formed using a material or materials having a second relative permittivity. In embodiments, the first relative permittivity exceeds the second relative permittivity at an operating frequencies above 80 GHz. In embodiments, the first relative permittivity may equal or exceed a value of 7 at operating frequencies above 80 GHz. In embodiments, the second relative permittivity may equal or be less than a value of 4 at operating frequencies above 80 GHz. In at least one embodiment, the waveguide member 110 may be fabricated using silicon nitride and the dielectric layer 120 may be fabricated using silicon oxide. In embodiments, the difference between the first relative permittivity and the second relative permittivity may be: about 3 or greater; about 5 or greater; about 7 or greater; about 10 or greater; about 15 or greater; about 20 or greater; or about 25 or greater.

The waveguide member 110 may have any physical size, shape, or cross-sectional geometry. The dimensions of the waveguide member 110 may be based, at least in part, on the design or target operating frequency of the semiconductor dies above and beneath the interposer layer 100. The waveguide member 110 may have a height of from about 2 micrometers (µm) to about 250 m. The waveguide member 110 may have a width of from about 5 micrometers (µm) to about 500 m. The waveguide member 110 may have a length of from about 750 micrometers (µm) to about 50 millimeters.

The dielectric layer 120 may have any size shape or physical configuration. In embodiments, the dielectric layer 120 may have a physical configuration based, at least in part on either or both, the semiconductor die disposed above the interposer layer 100 and/or the semiconductor die disposed beneath the interposer layer 100. In some implementations, the thickness of the dielectric layer 120 may be based, at least in part, on a defined or allowable z-height of the semiconductor package 200. The method 800 concludes at 806.

Figure 9:
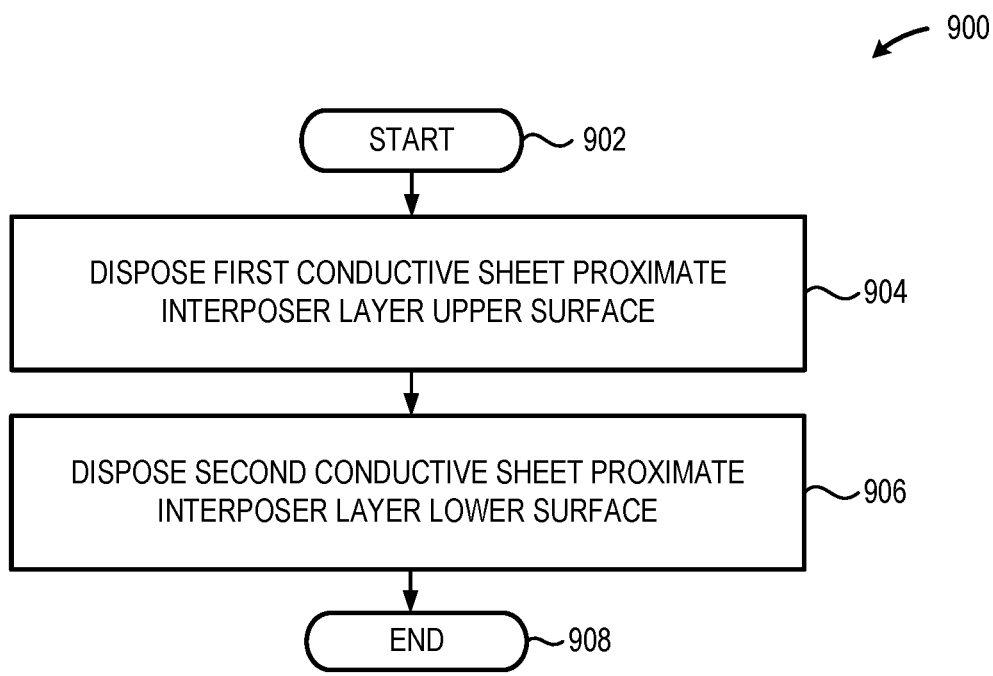
FIG. 9 is a high-level logic flow diagram of an illustrative method of forming an interposer layer that includes an integral microwave waveguide member a first conductive sheet and a second conductive sheet, in accordance with at least one embodiment described herein.

FIG. 9 is a high-level logic flow diagram of an illustrative method 900 of forming an interposer layer 100 that includes an integral microwave waveguide member 110 a first conductive sheet 130 and a second conductive sheet 140, in accordance with at least one embodiment described herein. The method 900 may be used in conjunction with the method 800 described in detail in FIG. 8. The method 900 commences at 902.

At 904, a first conductive layer 130 is disposed proximate an upper surface of an interposer layer formed by a waveguide member 110 and a dielectric layer 120. The first conductive layer 130 may be deposited in, on, about, or across all or a portion of the upper surface of the interposer layer. In embodiments, the first conductive layer 130 may be disposed proximate at least the waveguide member 110. In other embodiments, the first conductive layer 130 may be disposed proximate the waveguide member 110 and all or a portion of the dielectric layer 120. The first conductive layer 130 may be deposited using any currently available or future developed material deposition method or process. Example deposition processes include, but are not limited to: chemical vapor deposition, physical vapor deposition, thin film deposition, atomic layer deposition, sputtering, electroplating, spin coating, and similar. The first conductive layer 130 may include one or more electrically conductive materials, such as copper, a copper containing alloy, aluminum, an aluminum containing alloy, conductive polymers, and/or conductive organic compounds. The first conductive layer 130 may have a thickness of from about 1 micrometer ($\mu$m) to about 250 m.

At 906, a second conductive layer 140 is disposed proximate a lower surface of an interposer layer formed by a waveguide member 110 and a dielectric layer 120. The second conductive layer 140 may be deposited in, on, about, or across all or a portion of the lower surface of the interposer layer. In embodiments, the second conductive layer 140 may be disposed proximate at least the waveguide member 110. In other embodiments, the second conductive layer 140 may be disposed proximate the waveguide member 110 and all or a portion of the dielectric layer 120. The second conductive layer 140 may be deposited using any currently available or future developed material deposition method or process. Example deposition processes include, but are not limited to: chemical vapor deposition, physical vapor deposition, thin film deposition, atomic layer deposition, sputtering, electroplating, spin coating, and similar. The second conductive layer 140 may include one or more electrically conductive materials, such as copper, a copper containing alloy, aluminum, an aluminum containing alloy, conductive polymers, and/or conductive organic compounds. The second conductive layer 140 may have a thickness of from about 1 micrometer ($\mu$m) to about 250 m. The method 900 concludes at 908.

Figure 10:
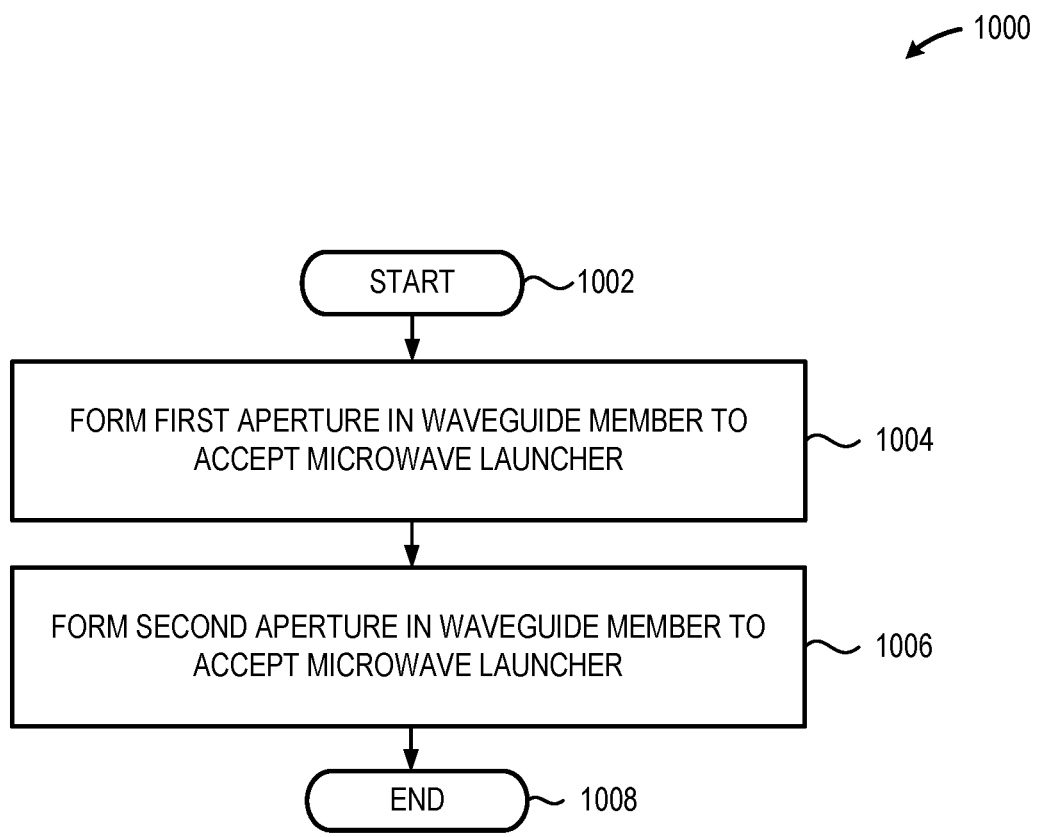
FIG. 10 is a high-level logic flow diagram of an illustrative method of forming an interposer layer that includes an integral microwave waveguide member a first conductive sheet and a second conductive sheet, in accordance with at least one embodiment described herein.

FIG. 10 is a high-level logic flow diagram of an illustrative method 1000 of forming an interposer layer 100 that includes an integral microwave waveguide member 110 a first conductive sheet 130 and a second conductive sheet 140, in accordance with at least one embodiment described herein. The method 1000 may be used in conjunction with either or both the method 800 described in detail in FIG. 8 and/or the method 900 described in detail in FIG. 9. The method 1000 commences at 1002.

At 1004, a first aperture 150 is formed in the upper surface of the interposer layer 100. The first aperture 150 accepts the insertion of a first microwave launcher assembly 214 operably coupled to the first semiconductor die 222100 disposed proximate the waveguide 110.

At 1006, a second aperture 160 is formed in one of the upper surface or the lower surface of the interposer layer 100. The second aperture 160 accepts the insertion of a second microwave launcher assembly 224 operably coupled to the second semiconductor die 220 disposed proximate the waveguide 110. The method 1000 concludes at 1006.

While FIGS. 8 through 10 illustrate various operations according to one or more embodiments, it is to be understood that not all of the operations depicted in FIGS. 8 through 10 are necessary for other embodiments. Indeed, it is fully contemplated herein that in other embodiments of the present disclosure, the operations depicted in FIGS. 8 through 10, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

Any of the operations described herein may be implemented in a system that includes one or more mediums (e.g., non-transitory storage mediums) having stored therein, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), rewritable compact disks (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software executed by a programmable control device.

Thus, the present disclosure is directed to an interposer layer that includes a waveguide to facilitate high speed (e.g., greater than 80 GHz) communication between semiconductor dies in a semiconductor package. An interposer layer may include a waveguide member and a dielectric layer disposed adjacent at least a portion of an exterior perimeter of the waveguide member. The waveguide member includes a material having a first relative permittivity. The dielectric member includes a material having a second relative permittivity that is less than the first relative permittivity. The waveguide member and the dielectric member form an interposer layer having an upper surface and a lower surface. A first conductive sheet may be disposed proximate the upper surface of the interposer layer and a second conductive sheet may be disposed proximate the lower surface of the interposer layer.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for fabricating an interposer layer or interposer die that includes an integral waveguide to facilitate communications between semiconductor dies included in a semiconductor package.

According to example 1, there is provided a semiconductor package interposer layer. The interposer layer may include: a waveguide member formed using a first material having a first relative permittivity; and a die member formed using a second material having a second relative permittivity, the die member disposed about at least a portion of an exterior perimeter of the waveguide member; wherein the first relative permittivity is greater than the second relative permittivity; and wherein the waveguide member and the die member form the interposer layer, the interposer layer having a planar first surface and a parallel, transversely opposed, planar second surface.

Example 2 may include elements of example 1 where the first material comprises a material or combination of materials having a first relative permittivity greater than 7.

Example 3 may include elements of any of examples 1 or 2 where the first material comprises silicon nitride (first relative permittivity 7.5).

Example 4 may include elements of any of examples 1 through 3 where the second material comprises a material or combination of materials having a second relative permittivity less than 4.

Example 5 may include elements of any of examples 1 through 4 where the second material comprises silicon dioxide (second relative permittivity 3.9).

Example 6 may include elements of any of examples 1 through 5 where the difference between the first relative permittivity constant and the second relative permittivity is greater than 3.

Example 7 may include elements of any of examples 1 through 6 where the waveguide member comprises a waveguide member having a uniform rectangular cross section.

Example 8 may include elements of any of examples 1 through 7 where the rectangular waveguide member comprises a rectangular waveguide member having a height of from about 5 micrometers (µm) to about 100 µm and a width of from about 20 micrometers (µm) to about 200 µm.

Example 9 may include elements of any of examples 1 through 8, and the interposer layer may additionally include: a first conductive member disposed proximate the upper surface of the interposer layer; and a second conductive member disposed proximate the lower surface of the interposer layer.

Example 10 may include elements of any of examples 1 through 9 where the first conductive member and the second conductive member each comprise a planar, metal or metal alloy, member having a thickness.

Example 11 may include elements of any of examples 1 through 10 where the first conductive member and the second conductive member each comprise a copper containing member having a thickness of from about 1 micrometer (µm) to about 200 µm.

Example 12 may include elements of any of examples 1 through 11, and the interposer layer may additionally include: a first aperture formed through the first conductive member and a correspondingly positioned and sized first recess formed in the waveguide member to receive a first microwave launcher assembly; and a second aperture formed through one of the first conductive member or the second conductive member and a correspondingly positioned and sized second recess formed in the waveguide member to receive a second microwave launcher assembly.

Example 13 may include elements of any of examples 1 through 12 where the waveguide member comprises a hollow waveguide member having an exterior perimeter; and where the die member at least partially surrounds the exterior perimeter of the hollow waveguide member.

Example 14 may include elements of any of examples 1 through 13 where the hollow waveguide member comprises an electrically conductive hollow waveguide member.

Example 15 may include elements of any of examples 1 through 14, and the interposer layer may additionally include: one or more dielectric materials at least partially filling the hollow waveguide member.

According to example 16, there is provided a method of fabricating a semiconductor package interposer layer. The method may include: disposing an interposer die layer about at least a portion of an exterior perimeter of a waveguide member; wherein the waveguide member comprises a material having a first dielectric constant; wherein the interposer die layer comprises a material having a second dielectric constant, the second dielectric constant less than the first dielectric constant; wherein the waveguide member and the die member form the interposer layer, the interposer layer having a planar first surface and a parallel, transversely opposed, planar second surface.

Example 17 may include elements of example 16, and the method may additionally include: forming the waveguide member using material or combination of materials having a first relative permittivity greater than 7.

Example 18 may include elements of any of examples 16 or 17 where forming the waveguide member using material or combination of materials having a first relative permittivity greater than 7 may further include: forming a waveguide member that includes silicon nitride (first relative permittivity of 7.5).

Example 19 may include elements of any of examples 16 through 18 where disposing an interposer die layer about at least a portion of a waveguide member may further include: disposing an interposer die layer using a material or combination of materials having a second relative permittivity less than 4 about at least a portion of the waveguide member.

Example 20 may include elements of any of examples 16 through 19 where disposing an interposer die layer using a material or combination of materials having a second relative permittivity less than 4 about at least a portion of the waveguide member may further include: disposing an interposer die layer that includes silicon dioxide (dielectric constant 3.9) about at least a portion of the waveguide.

Example 21 may include elements of any of examples 16 through 20 where disposing an interposer die layer about at least a portion of a waveguide member may further include: disposing an interposer die layer about at least a portion of a waveguide member, wherein the difference between the first dielectric constant and the second relative permittivity is greater than 3.

Example 22 may include elements of any of examples 16 through 21 where disposing an interposer die layer about at least a portion of an external perimeter of a waveguide member may include: disposing an interposer die layer about at least a portion of an external perimeter of a waveguide member having a uniform rectangular cross section.

Example 23 may include elements of any of examples 16 through 22 where disposing an interposer die layer about at least a portion of an external perimeter of a waveguide member having a uniform rectangular cross section may further include: disposing an interposer die layer about at least a portion of an external perimeter of a waveguide member having a uniform rectangular cross section having a height of from about 5 micrometers (µm) to about 100 µm and a width of from about 20 micrometers (µm) to about 200 µm.

Example 24 may include elements of any of examples 16 through 23, and the method may additionally include: disposing a first conductive member proximate at least a portion of the upper surface of the interposer layer; and disposing a second conductive member proximate at least a portion of the lower surface of the interposer layer.

Example 25 may include elements of any of examples 16 through 24 where disposing a first conductive member proximate at least a portion of the upper surface of the interposer layer may further include: disposing a first conductive member that includes a planar, metal or metal alloy, member having a thickness proximate at least a portion of the upper surface of the interposer layer; and where disposing a second conductive member proximate at least a portion of the lower surface of the interposer layer may further include: disposing a second conductive member that includes a planar, metal or metal alloy, member having a thickness proximate at least a portion of the lower surface of the interposer layer.

Example 26 may include elements of any of examples 16 through 25 where disposing a first conductive member that includes a planar, metal or metal alloy, member having a thickness proximate at least a portion of the upper surface of the interposer layer may further include: disposing a first conductive member that includes a planar, metal or metal alloy, member having a thickness of from about 1 micrometer ($\mu$m) to about 200 $\mu$m proximate at least a portion of the upper surface of the interposer layer; and where disposing a second conductive member that includes a planar, metal or metal alloy, member having a thickness proximate at least a portion of the lower surface of the interposer layer may further include: disposing a second conductive member that includes a planar, metal or metal alloy, member having a thickness of from about 1 micrometer ($\mu$m) to about 200 $\mu$m proximate at least a portion of the lower surface of the interposer layer.

Example 27 may include elements of any of examples 16 through 26, and the method may additionally include: forming a first aperture formed through the first conductive member and forming a correspondingly positioned and sized first recess formed in the waveguide member to receive a first microwave launcher assembly; and forming a second aperture formed through one of the first conductive member or the second conductive member and forming a correspondingly positioned and sized second recess formed in the waveguide member to receive a second microwave launcher assembly.

Example 28 may include elements of any of examples 16 through 27 where disposing an interposer die layer about at least a portion of a waveguide member may further include: disposing an interposer die layer about at least a portion of a hollow waveguide member having an exterior perimeter.

Example 29 may include elements of any of examples 16 through 28 where disposing an interposer die layer about at least a portion of a hollow waveguide member may further include: disposing an interposer die layer about at least a portion of an electrically conductive, hollow, waveguide member.

Example 30 may include elements of any of examples 16 through 29 where disposing an interposer die layer about at least a portion of a hollow waveguide member may further include: disposing an interposer die layer about at least a portion of a hollow waveguide member, the hollow waveguide member at least partially filled with at least one dielectric material.

According to example 31, there is provided a semiconductor package. The semiconductor package may include: a first semiconductor die communicably coupled to a second semiconductor die via an interposer layer. The interposer layer may include: a waveguide member formed using a first material having a first dielectric constant; and a die member formed using a second material having a second dielectric constant, the die member disposed about at least a portion of an exterior perimeter of the waveguide member; where the first dielectric constant is greater than the second dielectric constant; and where the waveguide member and the die member form the interposer layer, the interposer layer having a planar first surface and a parallel, transversely opposed, planar second surface.

Example 32 may include elements of example 31 where the first material comprises a material or combination of materials having a first relative permittivity greater than 7.

Example 33 may include elements of any of examples 31 to 32 where the first material comprises silicon nitride (first relative permittivity 7.5).

Example 34 may include elements of any of examples 31 through 33 where the second material comprises a material or combination of materials having a second relative permittivity less than 4.

Example 35 may include elements of any of examples 31 through 34 where the second material comprises silicon dioxide (second relative permittivity 3.9).

Example 36 may include elements of any of examples 31 through 35 where the difference between the first relative permittivity and the second relative permittivity is greater than 3.

Example 37 may include elements of any of examples 31 through 36 where the waveguide member comprises a waveguide member having a uniform rectangular cross section.

Example 38 may include elements of any of examples 31 through 37 where the rectangular waveguide member comprises a rectangular waveguide member having a height of from about 5 micrometers ($\mu$m) to about 100 $\mu$m and a width of from about 20 micrometers ($\mu$m) to about 200 $\mu$m.

Example 39 may include elements of example 31 through 38, and the semiconductor package may additionally include: a first conductive member disposed proximate the upper surface of the interposer layer; and a second conductive member disposed proximate the lower surface of the interposer layer.

Example 40 may include elements of any of examples 31 through 39 where the first conductive member and the second conductive member each comprise a planar, metal or metal alloy, member having a thickness.

Example 41 may include elements of any of examples 31 through 40 where the first conductive member and the second conductive member each comprise a copper containing member having a thickness of from about 1 micrometer ($\mu$m) to about 200 $\mu$m.

Example 42 may include elements of any of examples 31 through 41, and the semiconductor package may additionally include: a first aperture formed through the first conductive member and a correspondingly positioned and sized first recess formed in the waveguide member; and a second aperture formed through one of the first conductive member or the second conductive member and a correspondingly positioned and sized second recess formed in the waveguide member.

Example 43 may include elements of any of examples 31 through 42 where the first semiconductor die includes a communicably coupled first microwave launcher operably coupleable to the first aperture and the first recess; and where the second semiconductor die includes a communicably coupled second microwave launcher operably coupleable to the second aperture and the second recess.

Example 44 may include elements of any of examples 31 through 43 where the waveguide member comprises a hollow waveguide member having an exterior perimeter; and where the die member at least partially surrounds the exterior perimeter of the hollow waveguide member.

Example 45 may include elements of any of examples 31 through 44 where the hollow waveguide member comprises an electrically conductive hollow waveguide member.

Example 46 may include elements of any of examples 31 through 45, and the semiconductor package may additionally include one or more dielectric materials at least partially filling the hollow waveguide member.

According to example 47, there is provided a system for fabricating a semiconductor package interposer layer. The system may include a means for disposing an interposer die layer about at least a portion of an exterior perimeter of a waveguide member; where the waveguide member comprises a material having a first dielectric constant; where the interposer die layer comprises a material having a second dielectric constant, the second dielectric constant less than the first dielectric constant; and where the waveguide member and the die member form the interposer layer, the interposer layer having a planar first surface and a parallel, transversely opposed, planar second surface.

Example 48 may include elements of example 47, and the system may additionally include: means for forming the waveguide member using material or combination of materials having a first relative permittivity greater than 7.

Example 49 may include elements of any of examples 47 or 48 where the means for forming the waveguide member using material or combination of materials having a first relative permittivity greater than 7 may further include: means for forming a waveguide member that includes silicon nitride (first relative permittivity 7.5).

Example 50 may include elements of any of examples 47 through 49 where the means for disposing an interposer die layer about at least a portion of a waveguide member may further include: a means for disposing an interposer die layer using a material or combination of materials having a second relative permittivity less than 4 about at least a portion of the waveguide member.

Example 51 may include elements of any of examples 47 through 50 where the means for disposing an interposer die layer using a material or combination of materials having a second relative permittivity less than 4 about at least a portion of the waveguide member further comprises: a means for disposing an interposer die layer that includes silicon dioxide (second relative permittivity 3.9) about at least a portion of the waveguide.

Example 52 may include elements of any of examples 47 through 51 where the means for disposing an interposer die layer about at least a portion of a waveguide member may further include: means for disposing an interposer die layer about at least a portion of a waveguide member, wherein the difference between the first relative permittivity and the second relative permittivity is greater than 3.

Example 53 may include elements of any of examples 47 through 52 where the means for disposing an interposer die layer about at least a portion of an external perimeter of a waveguide may include: a means for disposing an interposer die layer about at least a portion of an external perimeter of a waveguide member having a uniform rectangular cross section.

Example 54 may include elements of any of examples 47 through 53 where the means for disposing an interposer die layer about at least a portion of an external perimeter of a waveguide member having a uniform rectangular cross section may further include: means for disposing an interposer die layer about at least a portion of an external perimeter of a waveguide member having a uniform rectangular cross section having a height of from about 5 micrometers (μm) to about 100 μm and a width of from about 20 micrometers (μm) to about 200 μm.

Example 55 may include elements of any of examples 47 through 54, and the system may additionally include: means for disposing a first conductive member proximate at least a portion of the upper surface of the interposer layer; and means for disposing a second conductive member proximate at least a portion of the lower surface of the interposer layer.

Example 56 may include elements of any of examples 47 through 55 where the means for disposing a first conductive member proximate at least a portion of the upper surface of the interposer layer may further include: means for disposing a first conductive member that includes a planar, metal or metal alloy, member having a thickness proximate at least a portion of the upper surface of the interposer layer; and where the means for disposing a second conductive member proximate at least a portion of the lower surface of the interposer layer may further include: means for disposing a second conductive member that includes a planar, metal or metal alloy, member having a thickness proximate at least a portion of the lower surface of the interposer layer.

Example 57 may include elements of any of examples 47 through 56 where the means for disposing a first conductive member that includes a planar, metal or metal alloy, member having a thickness proximate at least a portion of the upper surface of the interposer layer may further include: means for disposing a first conductive member that includes a planar, metal or metal alloy, member having a thickness of from about 1 micrometer (μm) to about 200 μm proximate at least a portion of the upper surface of the interposer layer; and where the means for disposing a second conductive member that includes a planar, metal or metal alloy, member having a thickness proximate at least a portion of the lower surface of the interposer layer may further include: means for disposing a second conductive member that includes a planar, metal or metal alloy, member having a thickness of from about 1 micrometer (μm) to about 200 μm proximate at least a portion of the lower surface of the interposer layer.

Example 58 may include elements of any of examples 47 through 57, and the system may additionally include: means for forming a first aperture through the first conductive member and a correspondingly positioned and sized first recess formed in the waveguide member; and means for forming a second aperture through one of the first conductive member or the second conductive member and a correspondingly positioned and sized second recess formed in the waveguide member.

Example 59 may include elements of any of examples 47 through 58 where the means for disposing an interposer die layer about at least a portion of a waveguide member may further include: means for disposing an interposer die layer about at least a portion of a hollow waveguide member having an exterior perimeter.

Example 60 may include elements of any of examples 47 through 59 where the means for disposing an interposer die layer about at least a portion of a hollow waveguide member may further include: means for disposing an interposer die layer about at least a portion of an electrically conductive, hollow, waveguide member.

Example 61 may include elements of any of examples 47 through 60 where the means for disposing an interposer die layer about at least a portion of a hollow waveguide member may further include: means for disposing an interposer die layer about at least a portion of a hollow waveguide member, the hollow waveguide member at least partially filled with at least one dielectric material.

According to example 62, there is provided an electronic device. The electronic device may include: a printed circuit board; and a semiconductor package operably coupled to the printed circuit board. The semiconductor package may include: a waveguide member formed using a first material having a first dielectric constant; and a die member formed using a second material having a second dielectric constant, the die member disposed about at least a portion of an exterior perimeter of the waveguide member; wherein the first dielectric constant is greater than the second dielectric constant; and wherein the waveguide member and the die member form the interposer layer, the interposer layer having a planar first surface and a parallel, transversely opposed, planar second surface.

Example 63 may include elements of example 62 where the first material comprises a material or combination of materials having a first relative permittivity greater than 7.

Example 64 may include elements of any of examples 62 or 63 where the first material comprises silicon nitride (first relative permittivity of 7.5).

Example 65 may include elements of any of examples 62 through 64 where the second material comprises a material or combination of materials having a second relative permittivity of less than 4.

Example 66 may include elements of any of examples 62 through 65 where the second material comprises silicon dioxide (second relative permittivity of 3.9).

Example 67 may include elements of any of examples 62 through 66 where the difference between the first relative permittivity and the second relative permittivity is greater than 3.

Example 68 may include elements of any of examples 62 through 67 where the waveguide member comprises a waveguide member having a uniform rectangular cross section.

Example 69 may include elements of any of examples 62 through 68 where the rectangular waveguide member comprises a rectangular waveguide member having a height of from about 5 micrometers (μm) to about 100 μm and a width of from about 20 micrometers (μm) to about 200 μm.

Example 70 may include elements of examples 62 through 69 where the semiconductor package interposer layer further comprises: a first conductive member disposed proximate the upper surface of the interposer layer; and a second conductive member disposed proximate the lower surface of the interposer layer.

Example 71 may include elements of any of examples 62 through 70 where the first conductive member and the second conductive member each comprise a planar, metal or metal alloy, member having a thickness.

Example 72 may include elements of any of examples 62 through 71 where the first conductive member and the second conductive member each comprise a copper containing member having a thickness of from about 1 micrometer (μm) to about 200 μm.

Example 73 may include elements of any of examples 62 through 72 where semiconductor package interposer layer may further include: a first aperture formed through the first conductive member and a correspondingly positioned and sized first recess formed in the waveguide member to receive a first microwave launcher assembly; and a second aperture formed through one of the first conductive member or the second conductive member and a correspondingly positioned and sized second recess formed in the waveguide member to receive a second microwave launcher assembly.

Example 74 may include elements of any of examples 62 through 73 where the waveguide member comprises a hollow waveguide member having an exterior perimeter; and where the die member at least partially surrounds the exterior perimeter of the hollow waveguide member.

Example 75 may include elements of any of examples 62 through 74 where the hollow waveguide member comprises an electrically conductive hollow waveguide member.

Example 76 may include elements of any of examples 62 through 75 where the semiconductor package interposer layer may further include: one or more dielectric materials at least partially filling the hollow waveguide member.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed is:

1. A semiconductor package interposer layer comprising:
   a waveguide member formed using a first material having a first relative permittivity, the waveguide member having a first end opposite a second end, wherein a propagation direction of the waveguide member is from the first end and the second end or from the second end to the first end, and the waveguide member having a first side opposite a second side, the first side and the second side between the first and the second end; and
   a dielectric member formed using a second material having a second relative permittivity, the dielectric member adjacent to the first side and the second side of the waveguide member;
   wherein the first relative permittivity is greater than the second relative permittivity; and
   wherein the waveguide member and the dielectric member form the interposer layer, the interposer layer having a planar first surface and a parallel, transversely opposed, planar second surface.

2. The interposer layer of claim 1 wherein the first material comprises a material or combination of materials having a first relative permittivity greater than 7.

3. The interposer layer of claim 2 wherein the first material comprises silicon nitride.

4. The interposer layer of claim 2 wherein the second material comprises a material or combination of materials having a second relative permittivity less than 4.

5. The interposer layer of claim 4 wherein the second material comprises silicon dioxide.

6. The interposer layer of claim 1 wherein the difference between the first relative permittivity and the second relative permittivity is greater than 3.

7. The interposer layer of claim 1 wherein the waveguide member comprises a waveguide member having a uniform rectangular cross section having a height of from about 5 micrometers (μm) to about 100 μm and a width of from about 20 micrometers (μm) to about 200 μm.

8. The interposer layer of claim 1, further comprising:
   a first conductive member disposed proximate the upper surface of the interposer layer; and
   a second conductive member disposed proximate the lower surface of the interposer layer.

9. The interposer layer of claim 8 wherein the first conductive member and the second conductive member each comprise a planar, metal or metal alloy, member having a thickness.

10. The interposer layer of claim 9 wherein the first conductive member and the second conductive member each comprise a copper containing member having a thickness of from about 1 micrometer (μm) to about 200 μm.

11. The interposer layer of claim 9, further comprising:
a first aperture formed through the first conductive member and a correspondingly positioned and sized first recess formed in the waveguide member to receive a first microwave launcher assembly; and
a second aperture formed through one of: the first conductive member or the second conductive member and a correspondingly positioned and sized second recess formed in the waveguide member to receive a second microwave launcher assembly.

12. A method of fabricating a semiconductor package interposer layer, the method comprising:
forming a waveguide member, the waveguide member having a first end opposite a second end, wherein a propagation direction of the waveguide member is from the first end and the second end or from the second end to the first end, and the waveguide member having a first side opposite a second side, the first side and the second side between the first and the second end;
disposing an interposer dielectric member adjacent to the first side and the second side of the waveguide member;
wherein the waveguide member comprises a material having a first relative permittivity;
wherein the interposer dielectric member comprises a material having a second relative permittivity, the second relative permittivity less than the first relative permittivity;
wherein the waveguide member and the interposer dielectric member form the interposer layer, the interposer layer having a planar first surface and a parallel, transversely opposed, planar second surface.

13. The method of claim 12, further comprising:
forming the waveguide member using material or combination of materials having a first relative permittivity greater than 7.

14. The method of claim 13 wherein forming the waveguide member using material or combination of materials having a first relative permittivity greater than 7 further comprises:
forming a waveguide member that includes silicon nitride.

15. The method of claim 13 wherein
disposing the interposer dielectric member comprises using a material or combination of materials having the second relative permittivity less than 4.

16. The method of claim 15 wherein
the interposer dielectric member includes silicon dioxide.

17. The method of claim 12 wherein the difference between the first relative permittivity and the second relative permittivity is greater than 3.

18. The method of claim 12 wherein
the waveguide member has a uniform rectangular cross section having a height of from about 5 micrometers (μm) to about 100 μm and a width of from about 20 micrometers (μm) to about 200 μm.

19. The method of claim 12, further comprising:
disposing a first conductive member proximate at least a portion of the upper surface of the interposer layer; and
disposing a second conductive member proximate at least a portion of the lower surface of the interposer layer.

20. The method of claim 19:
wherein disposing a first conductive member proximate at least a portion of the upper surface of the interposer layer further comprises:
disposing a first conductive member that includes a planar, metal or metal alloy, member having a thickness proximate at least a portion of the upper surface of the interposer layer; and
wherein disposing a second conductive member proximate at least a portion of the lower surface of the interposer layer further comprises:
disposing a second conductive member that includes a planar, metal or metal alloy, member having a thickness proximate at least a portion of the lower surface of the interposer layer.

21. The method of claim 20:
wherein disposing a first conductive member that includes a planar, metal or metal alloy, member having a thickness proximate at least a portion of the upper surface of the interposer layer further comprises:
disposing a first conductive member that includes a planar, metal or metal alloy, member having a thickness of from about 1 micrometer (μm) to about 200 μm proximate at least a portion of the upper surface of the interposer layer; and
wherein disposing a second conductive member that includes a planar, metal or metal alloy, member having a thickness proximate at least a portion of the lower surface of the interposer layer further comprises:
disposing a second conductive member that includes a planar, metal or metal alloy, member having a thickness of from about 1 micrometer (μm) to about 200 μm proximate at least a portion of the lower surface of the interposer layer.

22. The method of claim 20, further comprising:
a first aperture formed through the first conductive member and a correspondingly positioned and sized first recess formed in the waveguide member to receive a first microwave launcher assembly; and
a second aperture formed through one of: the first conductive member or the second conductive member and a correspondingly positioned and sized second recess formed in the waveguide member to receive a second microwave launcher assembly.

23. A system for fabricating a semiconductor package interposer layer, the system comprising:
means for forming a waveguide member, the waveguide member having a first end opposite a second end, wherein a propagation direction of the waveguide member is from the first end and the second end or from the second end to the first end, and the waveguide member having a first side opposite a second side, the first side and the second side between the first and the second end;
means for disposing an interposer dielectric member adjacent to the first side and the second side of the waveguide member;
wherein the waveguide member comprises a material having a first relative permittivity;
wherein the interposer dielectric member comprises a material having a second relative permittivity, the second relative permittivity less than the first relative permittivity;
wherein the waveguide member and the dielectric member form the interposer layer, the interposer layer having a planar first surface and a parallel, transversely opposed, planar second surface.

24. The system of claim 23, further comprising:

means for forming the waveguide member using at least one material having a first relative permittivity greater than 7; and means for disposing an interposer dielectric member using at least one material having a second relative permittivity less than 4 about at least a portion of the waveguide member.

25. The system of claim 23, further comprising:

means for disposing a first conductive member proximate at least a portion of the upper surface of the interposer layer; and means for disposing a second conductive member proximate at least a portion of the lower surface of the interposer layer.

\* \* \* \* \*